United States Patent
Haga

(10) Patent No.: US 11,063,127 B2
(45) Date of Patent: Jul. 13, 2021

(54) SEMICONDUCTOR ELEMENT AND SEMICONDUCTOR DEVICE PROVIDED WITH THE SAME

(71) Applicant: Rohm Co., Ltd., Kyoto (JP)

(72) Inventor: Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 24 days.

(21) Appl. No.: 16/671,661

(22) Filed: Nov. 1, 2019

(65) Prior Publication Data

US 2020/0144379 A1 May 7, 2020

(30) Foreign Application Priority Data

Nov. 5, 2018 (JP) .............................. JP2018-208123

(51) Int. Cl.
| | |
|---|---|
| *H01L 29/41* | (2006.01) |
| *H01L 29/43* | (2006.01) |
| *H01L 23/00* | (2006.01) |
| *H01L 23/31* | (2006.01) |

(52) U.S. Cl.
CPC .......... *H01L 29/41* (2013.01); *H01L 23/3107* (2013.01); *H01L 24/05* (2013.01); *H01L 24/45* (2013.01); *H01L 29/43* (2013.01); *H01L 2224/05339* (2013.01)

(58) Field of Classification Search
CPC ..... H01L 29/41; H01L 29/43; H01L 29/0657; H01L 21/78; H01L 24/94; H01L 2224/94; H01L 23/3171
See application file for complete search history.

(56) References Cited

U.S. PATENT DOCUMENTS

| | | | | | |
|---|---|---|---|---|---|
| 6,133,637 | A | * | 10/2000 | Hikita | ..................... G01P 3/488 257/666 |
| 6,400,019 | B1 | * | 6/2002 | Hirashima | .............. H01L 24/05 257/737 |
| 2006/0030127 | A1 | * | 2/2006 | Fukasawa | ........... H01L 23/3107 438/460 |
| 2009/0250803 | A1 | * | 10/2009 | Arai | ........................ H01L 24/19 257/690 |
| 2011/0290863 | A1 | * | 12/2011 | Kajiwara | ............... B23K 1/206 228/227 |

FOREIGN PATENT DOCUMENTS

| | | | |
|---|---|---|---|
| JP | 2011-71381 A | 4/2011 | |
| WO | WO-2014181665 A1 | * 11/2014 | ......... H01L 27/1446 |

* cited by examiner

*Primary Examiner* — Syed I Gheyas
(74) *Attorney, Agent, or Firm* — Hamre, Schumann, Mueller & Larson, P.C.

(57) ABSTRACT

A semiconductor element includes an element body, a surface protective film and an electrode. The element body has a front surface and a side surface connected to the front surface. The surface protective film is supported on the front surface of the element body. The surface protective film has a cutout portion recessed inward from an outer edge of the surface protective film as viewed in a thickness direction of the element body. The electrode is disposed in the cutout portion and electrically connected to the element body. The element body has a ledge protruding with respect to the side surface in a direction perpendicular to the thickness direction. The ledge is adjacent to an opening of the cutout portion as viewed in the thickness direction.

20 Claims, 22 Drawing Sheets

SEMICONDUCTOR ELEMENT AND SEMICONDUCTOR DEVICE PROVIDED WITH THE SAME

FIELD

The present disclosure relates to semiconductor elements. The present disclosure also relates to semiconductor devices including semiconductor elements.

BACKGROUND

Conventionally, semiconductor elements including surface protective films of polyimide are widely known. Polyimide has excellent heat resistance, mechanical strength, chemical stability and electrical insulation. For example, JP-A-2011-71381 discloses a semiconductor element including a plurality of electrodes (bonding pads) and a surface protective film (polyimide film) having holes exposing the electrodes.

Generally, a semiconductor element is bonded to a die pad or other objects using a silver paste that will form a bonding layer. A surface protective film of polyimide may have fine pores. The fine pores may absorb moisture, which leads to migration of silver ions from the bonding layer into the pores. This degrades the electrical insulation resistance of the surface protective film, possibly causing a short circuit between electrodes.

One way to address the risk noted above is to remove portions of the surface protective film present between each hole and the outer edge of the semiconductor element. This structure can reduce the migration of silver ions from the bonding layer. However, a part of the silver paste may be pulled up by capillary action along the side surface of the semiconductor element. Without such portions of the surface protective film, the silver paste may reach an electrode and cause a connection failure between the electrode and a wire.

SUMMARY

In view of the above circumstances, the present disclosure aims to provide a semiconductor element designed to prevent a bonding layer from reaching an electrode. The present disclosure also aims to provide a semiconductor device that includes the semiconductor element.

One aspect of the present disclosure provides a semiconductor element including: an element body having a front surface and a side surface connected to the front surface; a surface protective film supported on the front surface of the element body, where the surface protective film has a cutout portion recessed inward from an outer edge of the surface protective film as viewed in a thickness direction of the element body; and an electrode disposed in the cutout portion and electrically connected to the element body. The element body has a ledge protruding with respect to the side surface in a direction perpendicular to the thickness direction. The ledge is adjacent to an opening of the cutout portion as viewed in the thickness direction.

Preferably, the surface protective film contains polyimide.

Preferably, the electrode contains gold.

Preferably, the element body includes a semiconductor substrate, a semiconductor layer formed on the semiconductor substrate, and a passivation film supported on the semiconductor layer. The electrode is electrically connected to the semiconductor layer. The surface protective film is in contact with the passivation film. The ledge is formed on the semiconductor substrate.

Preferably, the semiconductor substrate has a back surface opposite to the front surface, the ledge has a top surface and a bottom surface spaced apart from each other in the thickness direction, and the bottom surface of the ledge is flush with the back surface.

Preferably, the top surface of the ledge is concavely curved.

Preferably, the semiconductor substrate has a back surface opposite to the front surface, the ledge has a top surface and a bottom surface spaced apart from each other in the thickness direction, and the bottom surface of the ledge is offset from the back surface toward the front surface in the thickness direction.

Preferably, the top surface of the ledge is concavely curved.

Preferably, the bottom surface of the ledge is concavely curved.

Preferably, the ledge extends in a single direction perpendicular to the thickness direction as viewed in the thickness direction.

Preferably, the ledge extends continuously along an entire edge of the element body as viewed in the thickness direction.

The semiconductor element further includes a wiring layer electrically connecting the semiconductor layer and the electrode. The wiring layer is in contact with the passivation film.

Preferably, the semiconductor element further includes a barrier film interposed between the wiring layer and the electrode in the thickness direction, and the barrier film contains titanium.

Another aspect of the present disclosure provides a semiconductor device including a semiconductor element described above; a die pad on which the semiconductor element is mounted; and a bonding layer interposed between the die pad and the semiconductor element. The bonding layer contains Ag particles.

Preferably, the semiconductor device further includes: a terminal spaced apart from the die pad; and a wire connected to the terminal and the electrode.

Preferably, the semiconductor device further includes a sealing resin covering the semiconductor element and the wire.

Other features and advantages of the present disclosure will be more apparent by the following detailed description given with reference to the accompanying drawings.

DRAWINGS

Figure 13:
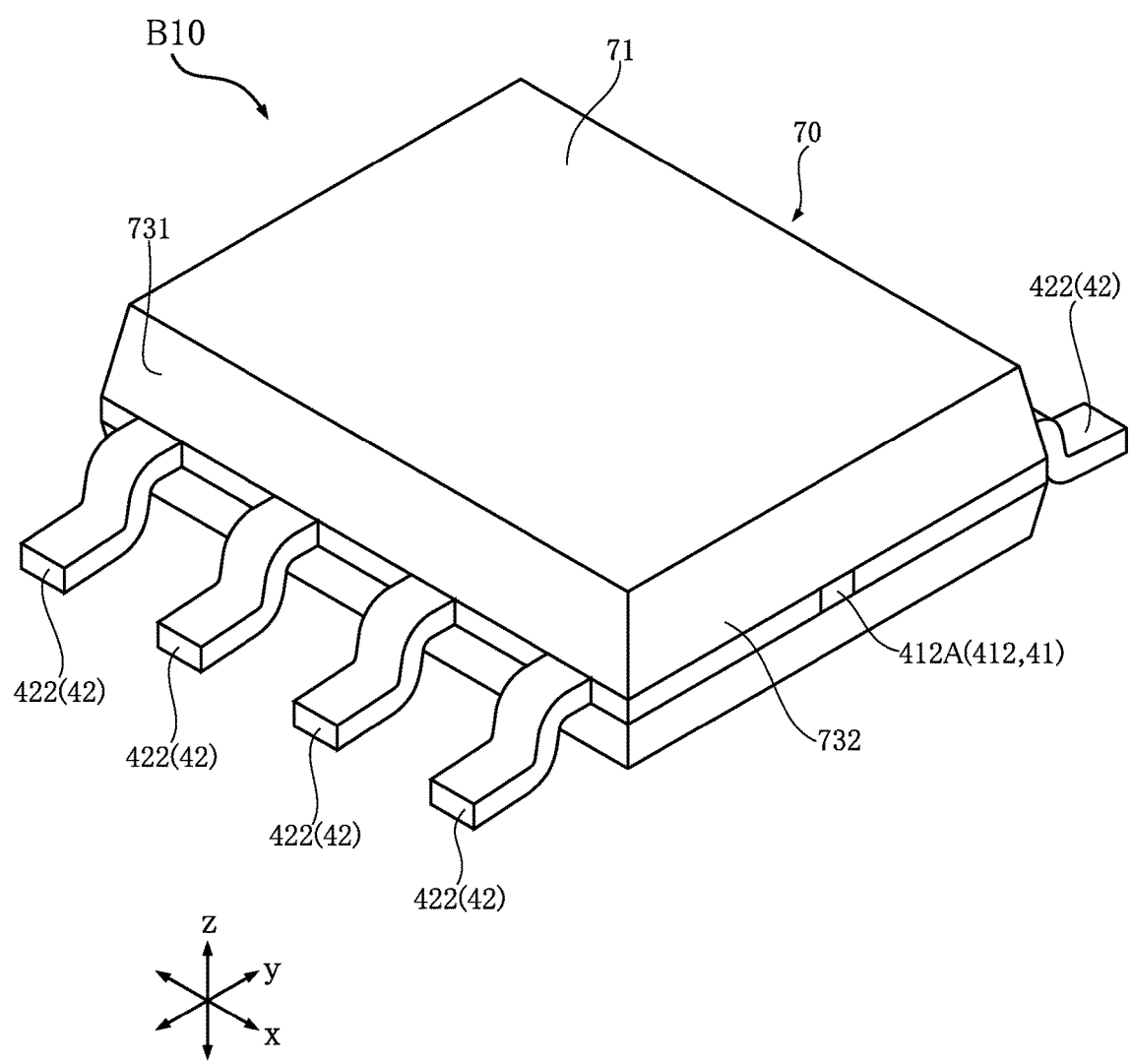

FIG. 13 a perspective view of the semiconductor element according to the first embodiment.

Figure 14:
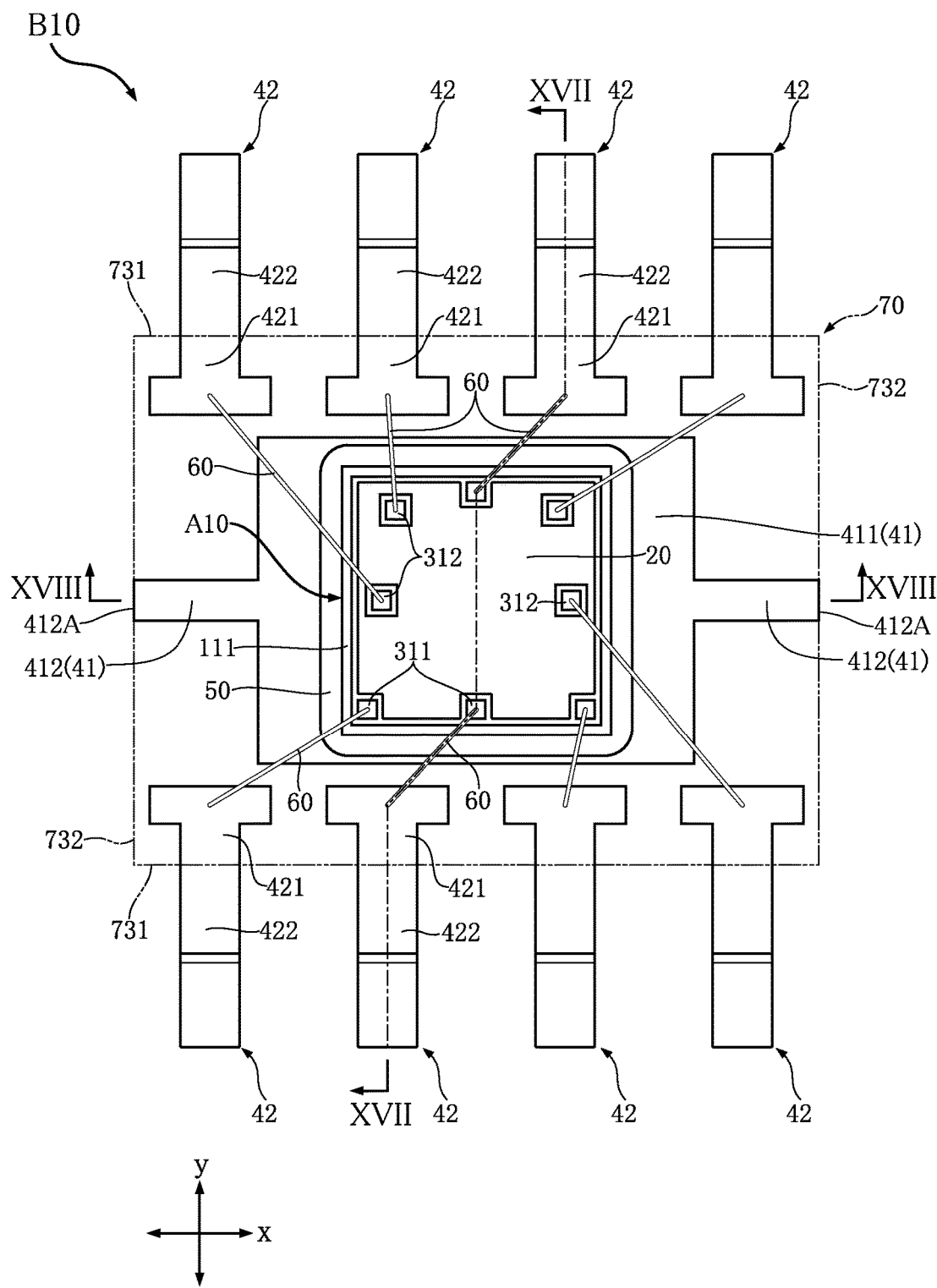

FIG. 14 is a plan view of the semiconductor device shown in FIG. 13 (through the sealing resin).

Figure 15:
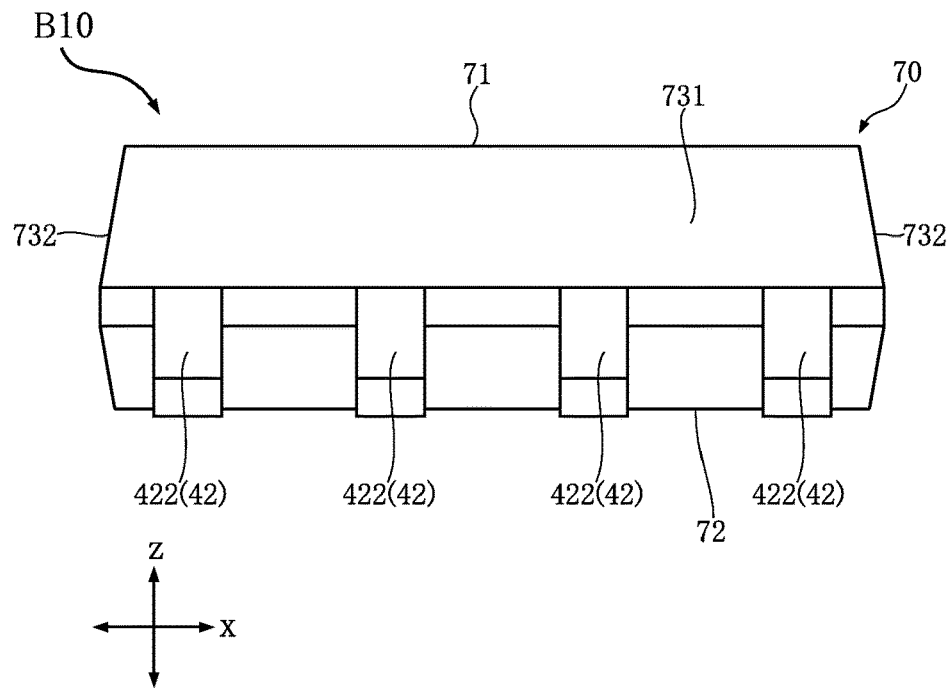

FIG. 15 is a front view of the semiconductor device shown in FIG. 13.

Figure 16:
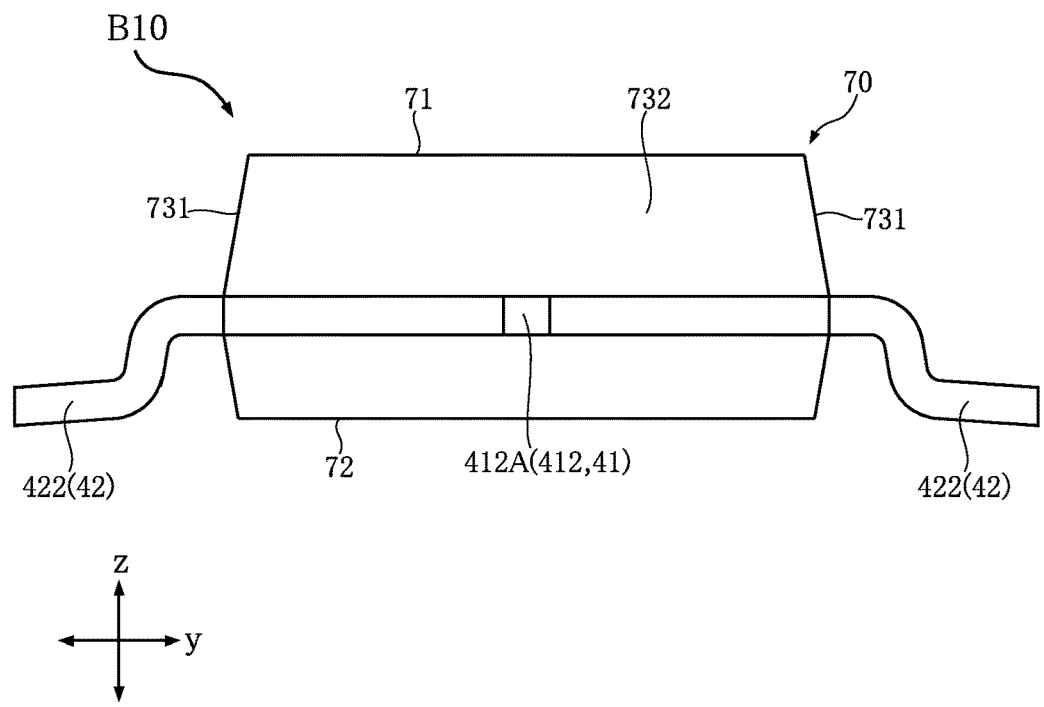

FIG. 16 is a right-side view of the semiconductor device shown in FIG. 13.

Figure 17:
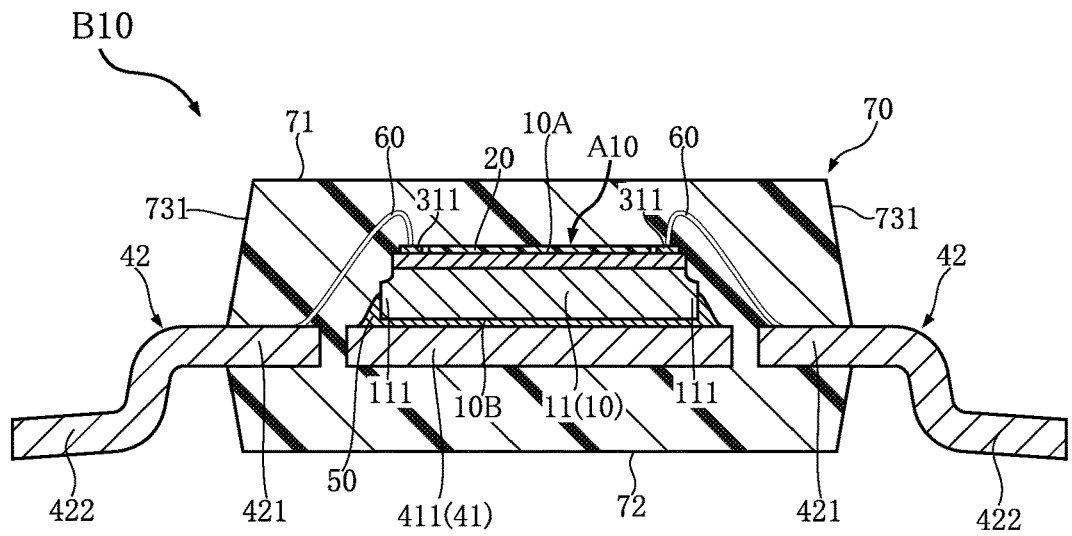
Figure 17:
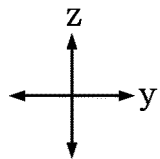

FIG. 17 is a sectional view taken along line XVII-XVII of FIG. 14.

Figure 18:
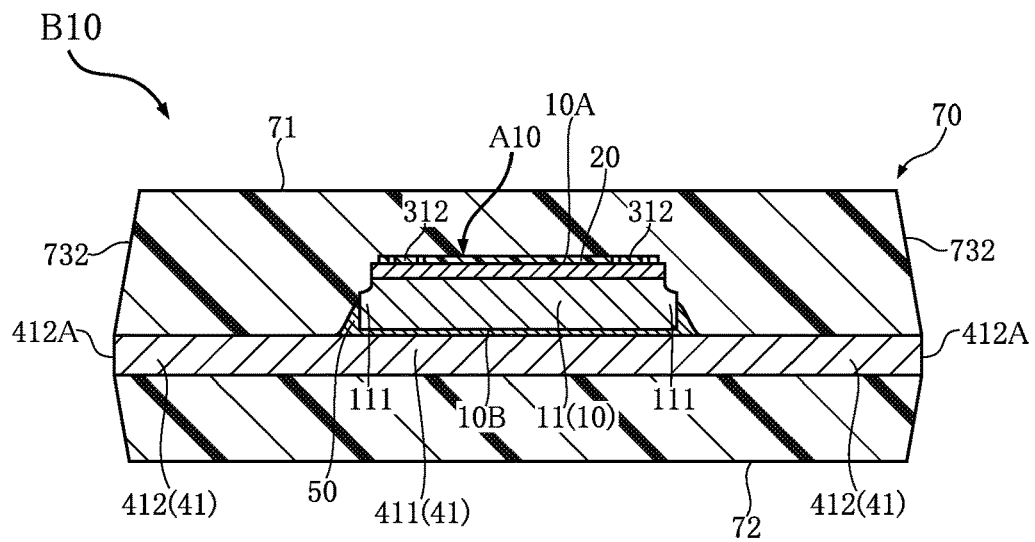
Figure 18:
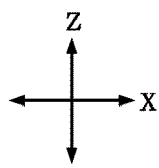

FIG. 18 is a sectional view taken along line XVIII-XVIII of FIG. 14.

Figure 19:
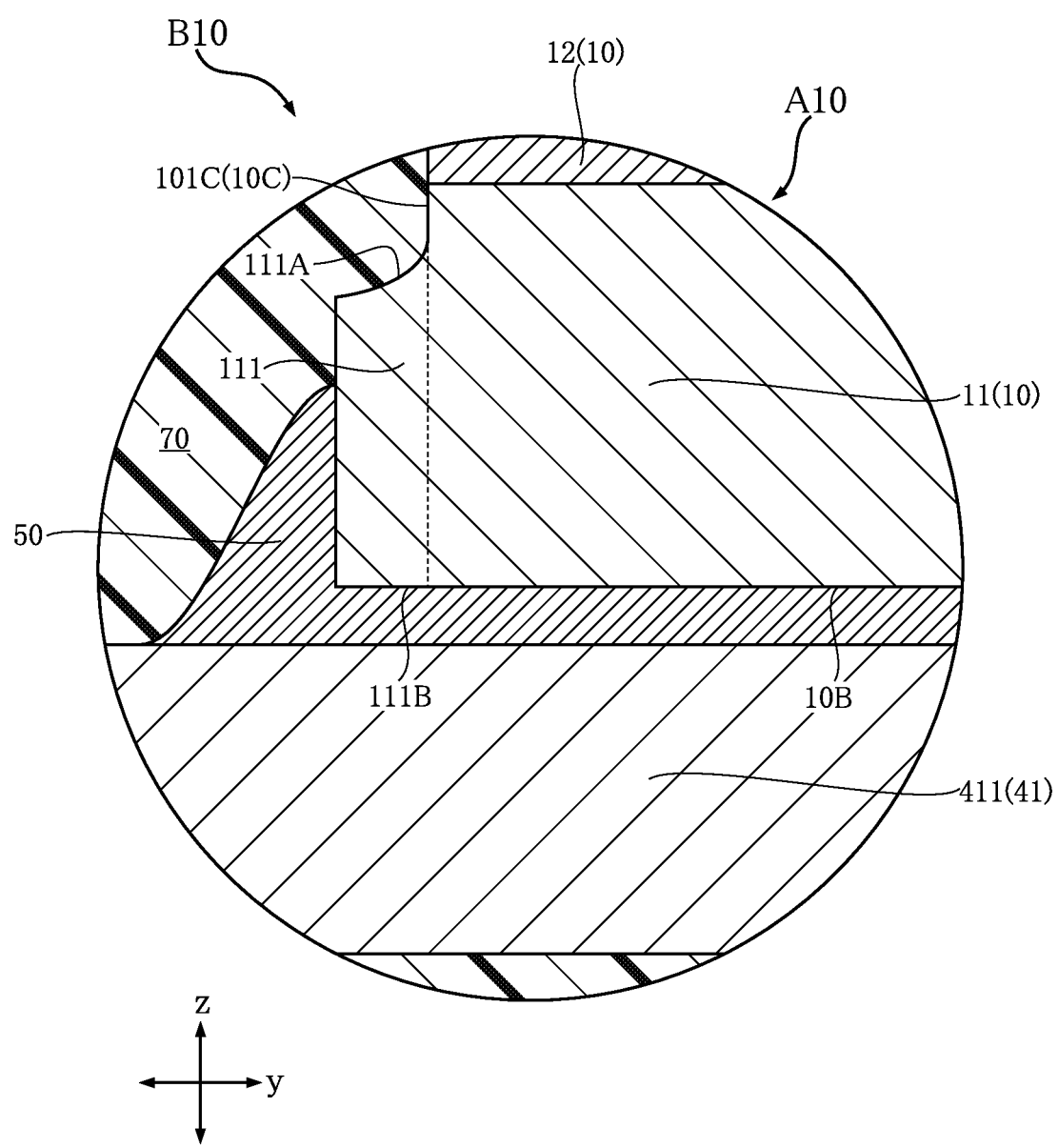

FIG. 19 is a partially enlarged view of FIG. 17.

Figure 20:
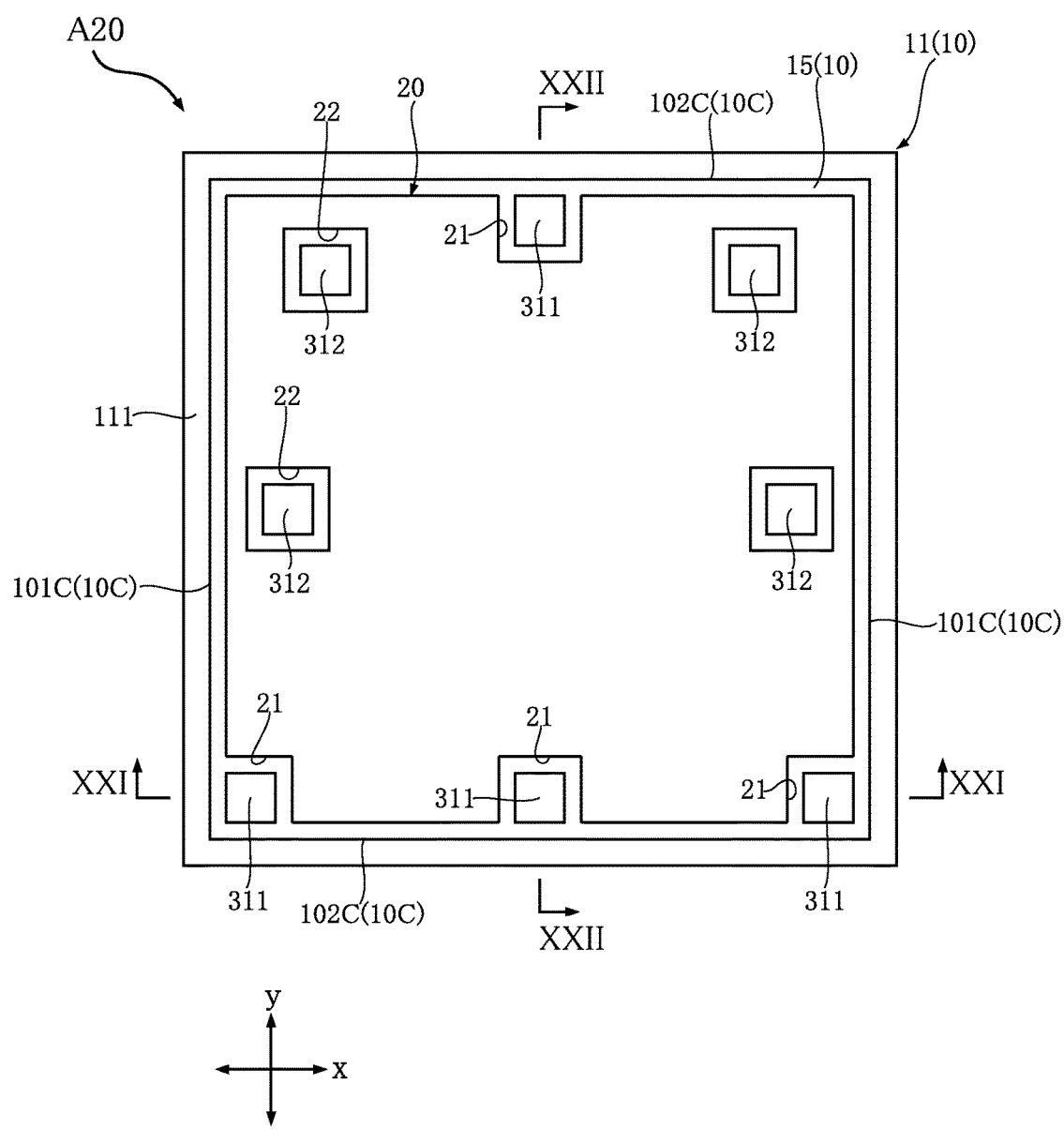

FIG. 20 is a plan view of a semiconductor element according to a second embodiment.

Figure 21:
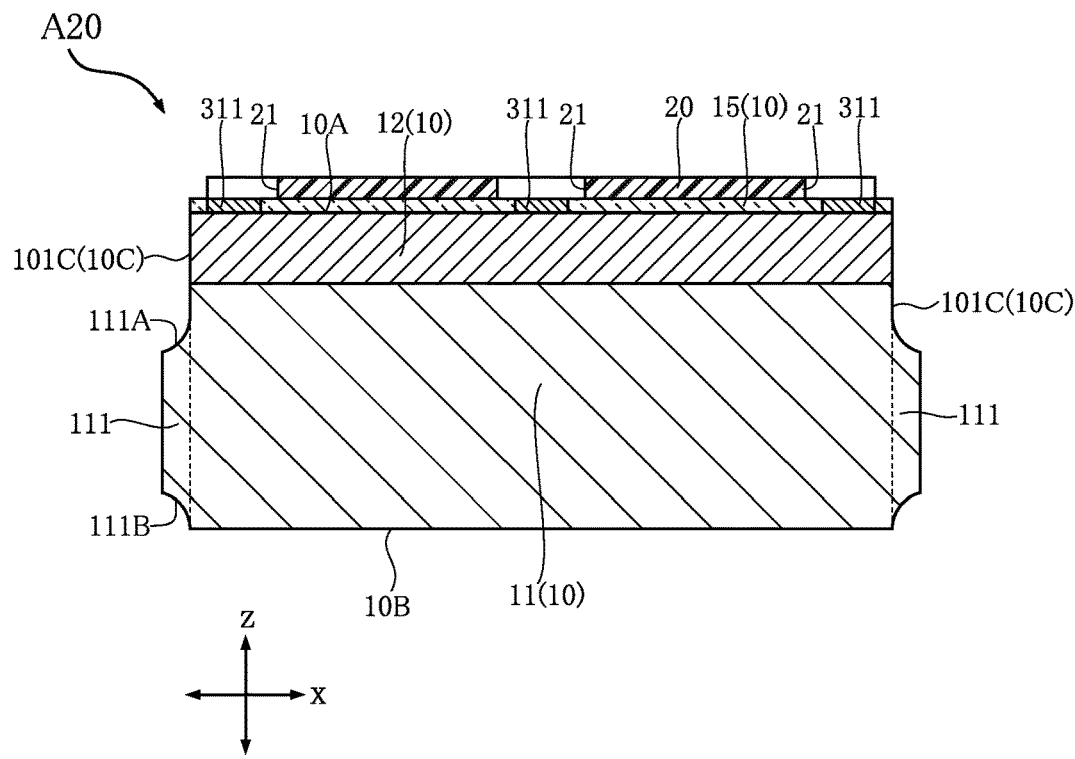

FIG. 21 is a sectional view taken along line XXI-XXI of FIG. 20.

Figure 22:
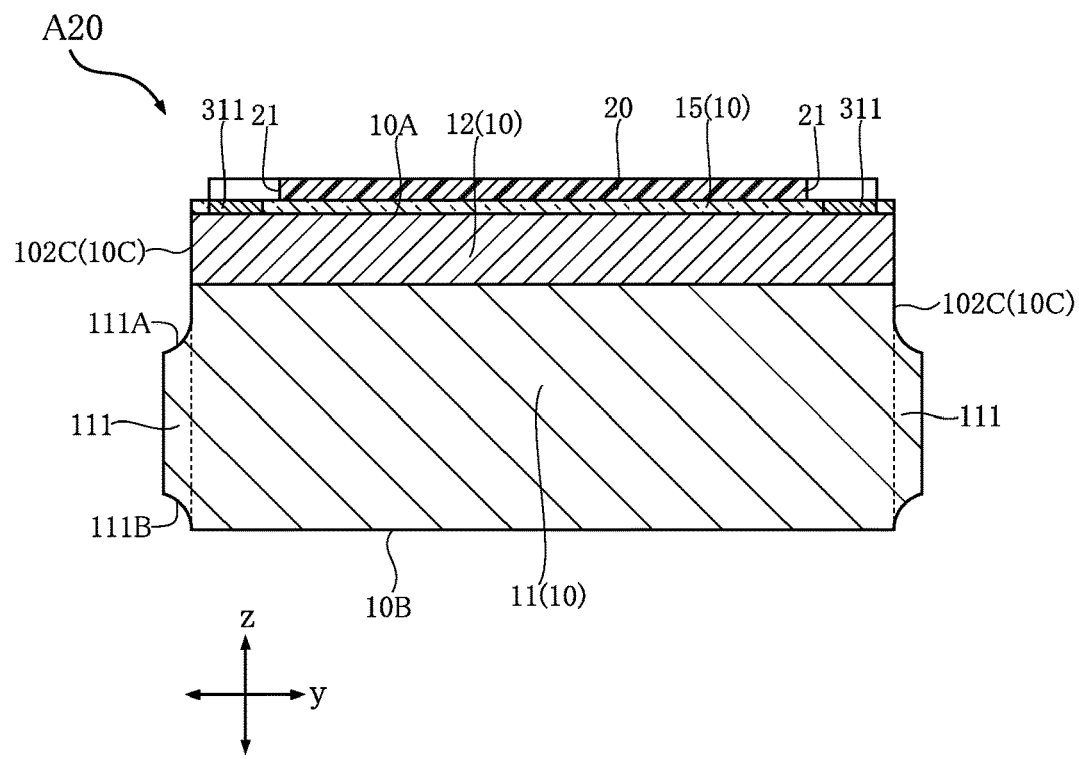

FIG. 22 is a sectional view taken along line XXII-XII of FIG. 20.

Figure 23:
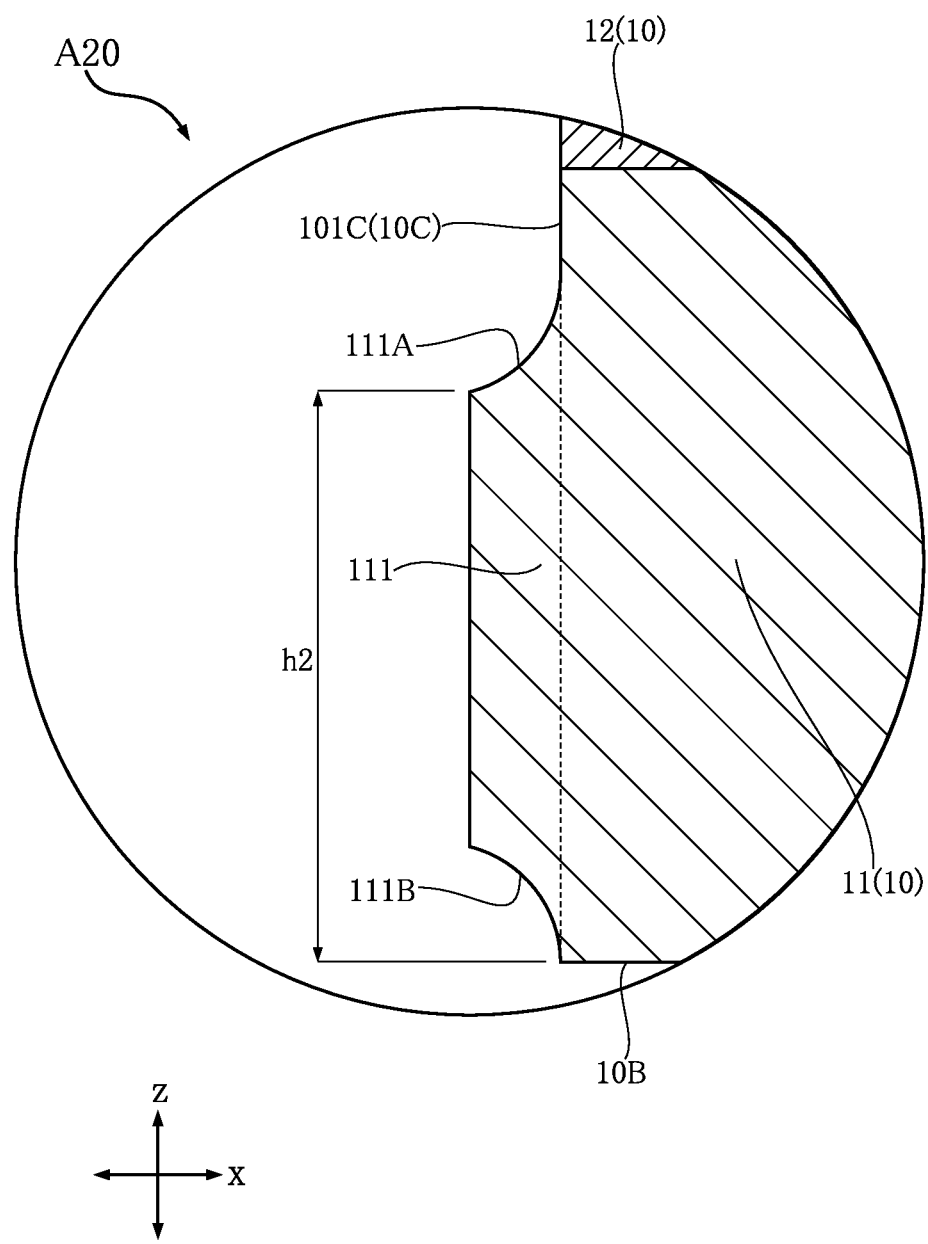

FIG. 23 is a partially enlarged view of FIG. 21.

Figure 24:
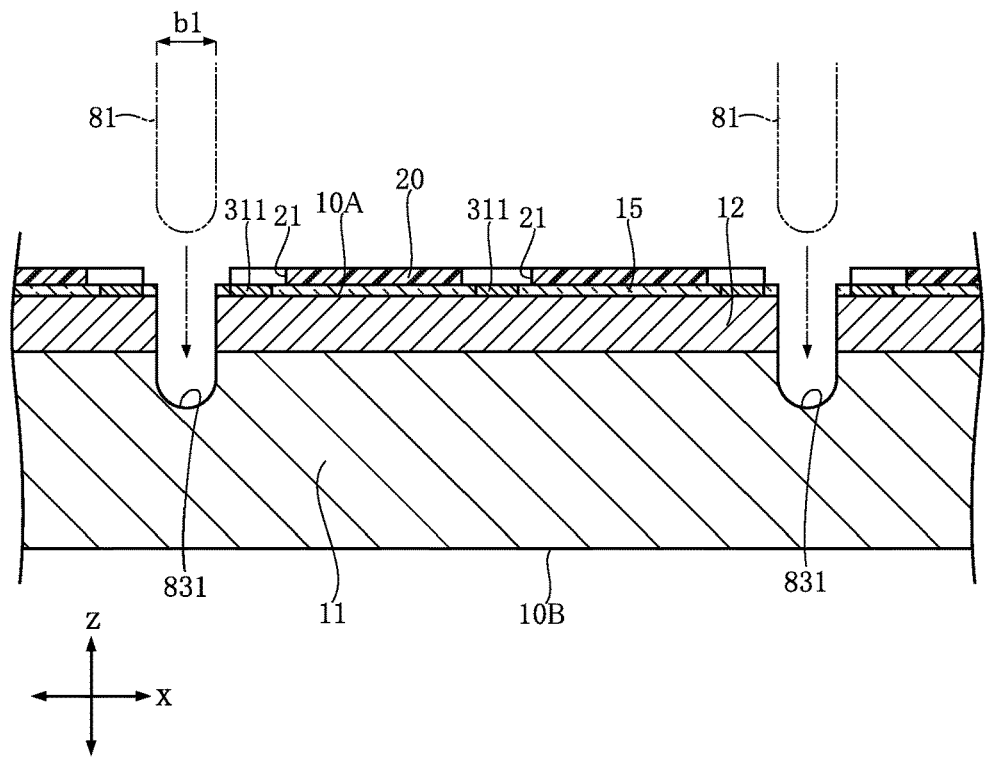

FIG. 24 is a sectional view illustrating a manufacturing process of the semiconductor element shown in FIG. 20.

Figure 25:
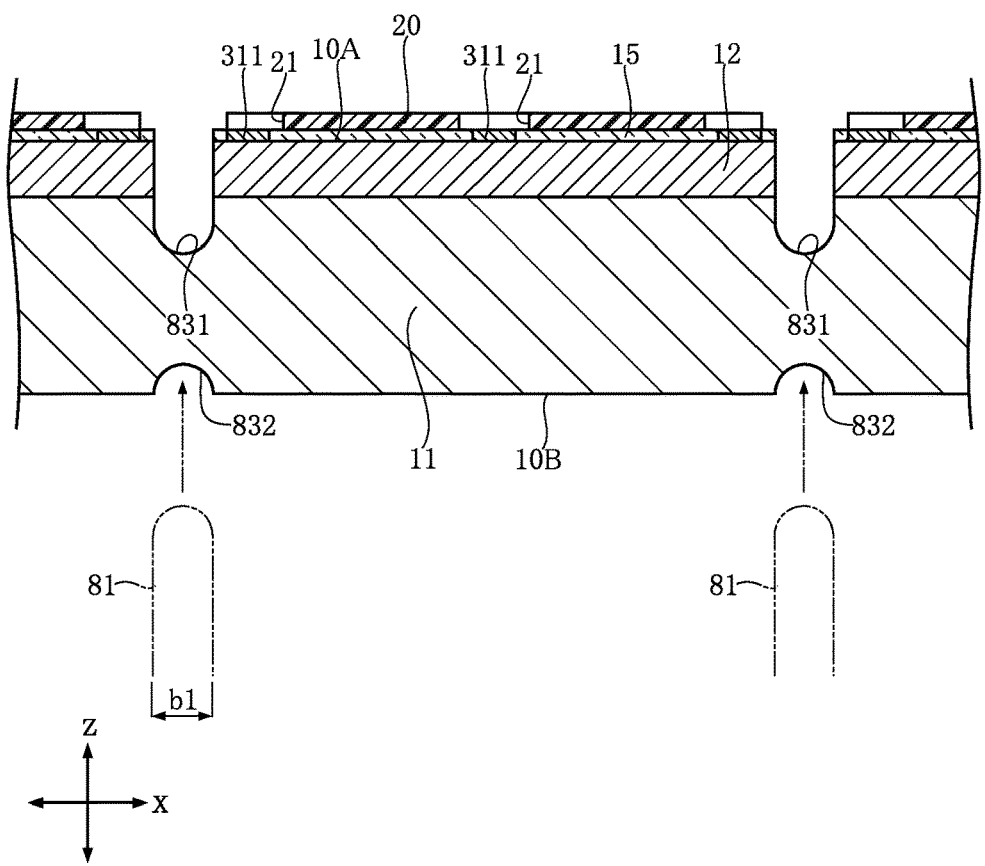

FIG. 25 is a sectional view illustrating a manufacturing process of the semiconductor element shown in FIG. 20.

Figure 26:
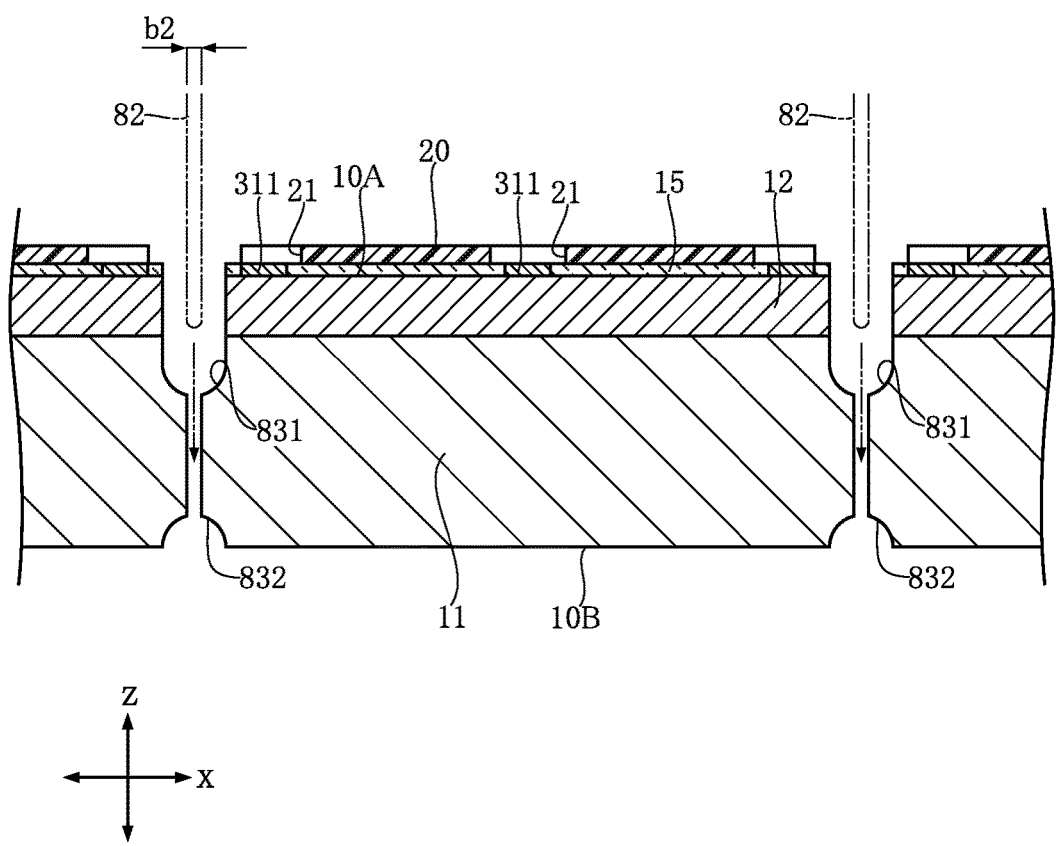

FIG. 26 is a sectional view illustrating a manufacturing process of the semiconductor element shown in FIG. 20.

Figure 27:
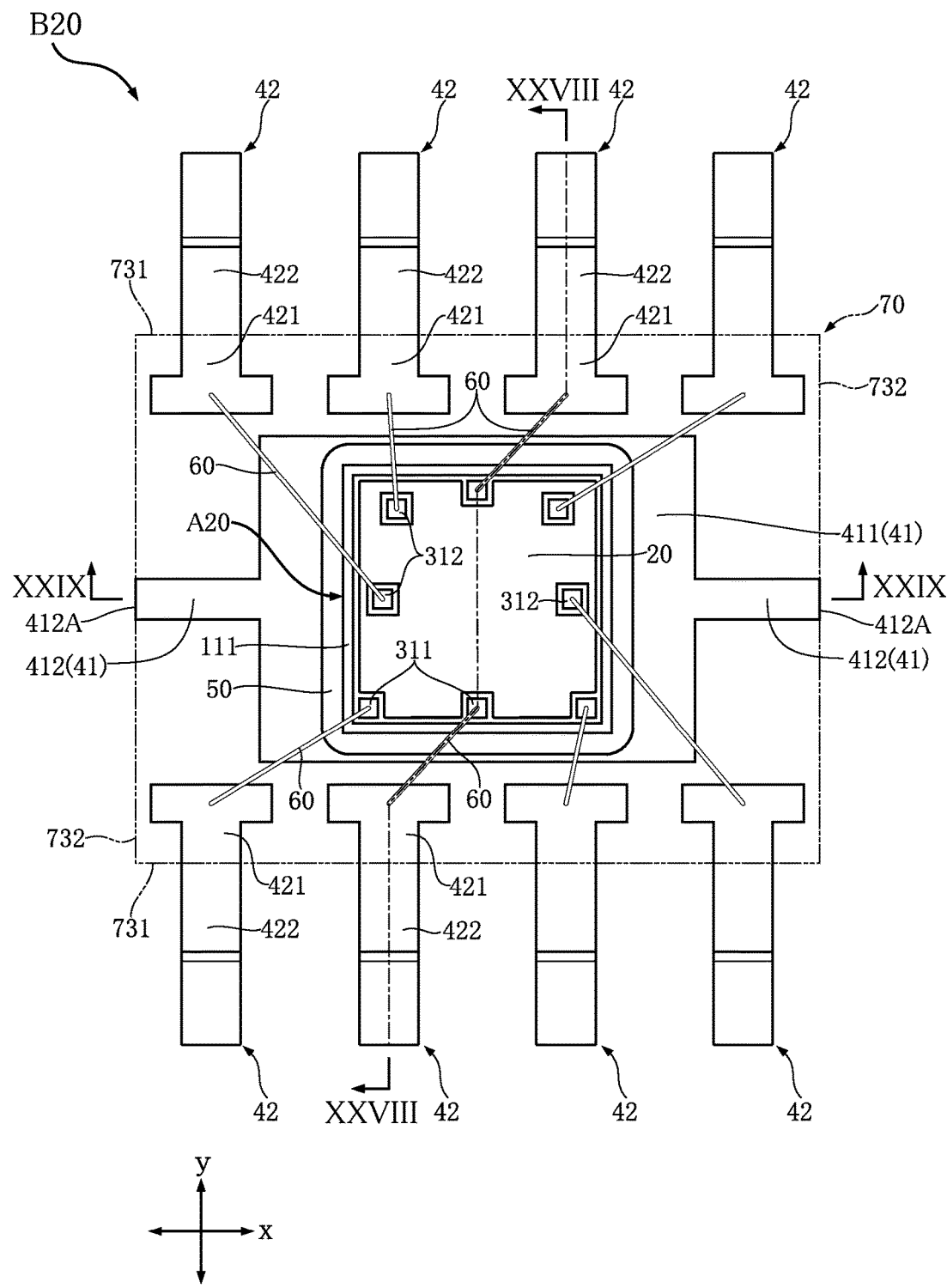

FIG. 27 is a plan view of the semiconductor element according to the second embodiment (through the sealing resin).

Figure 28:
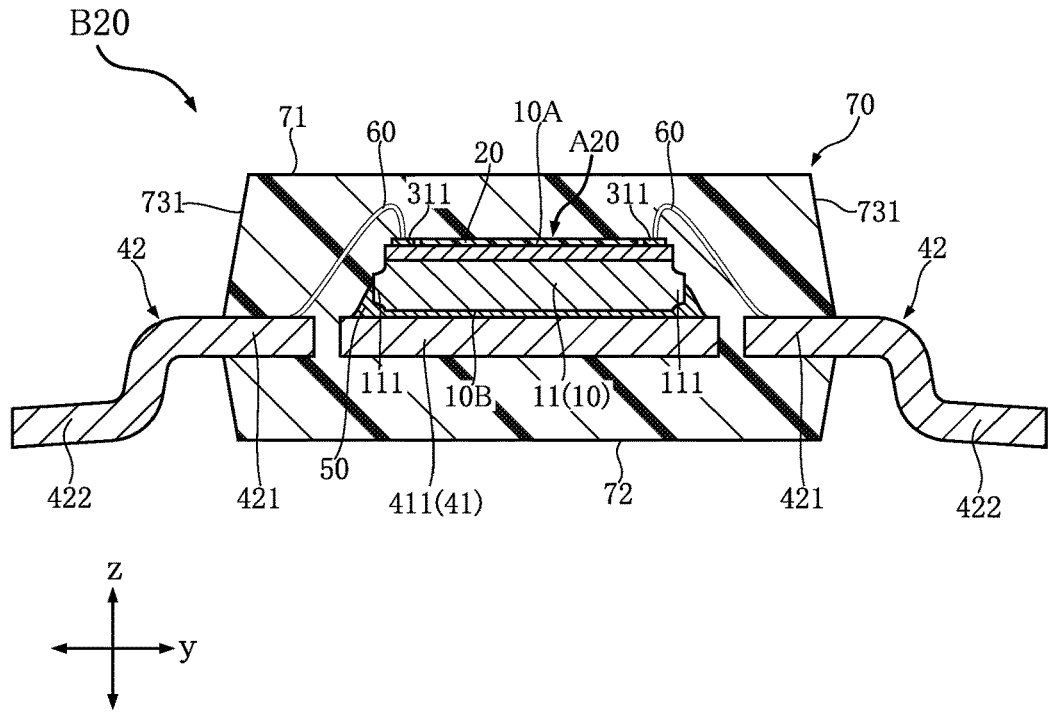

FIG. 28 is a sectional view taken along line XXVIII-XXVIII of FIG. 27.

Figure 29:
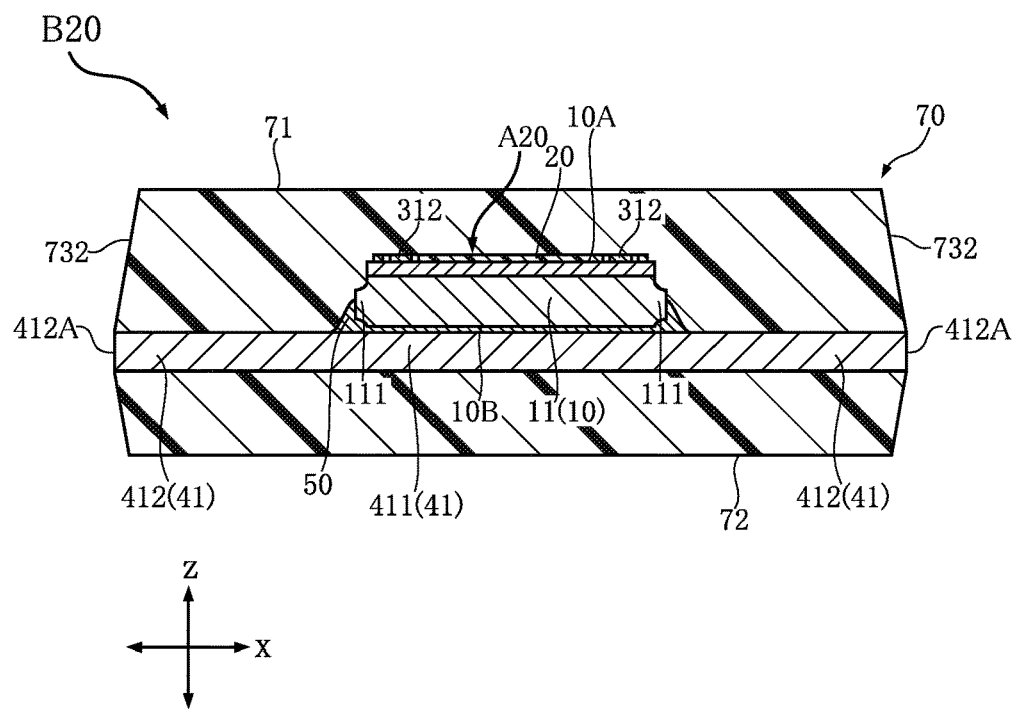

FIG. 29 is a sectional view taken along line XXIX-XXIX of FIG. 27.

Figure 30:
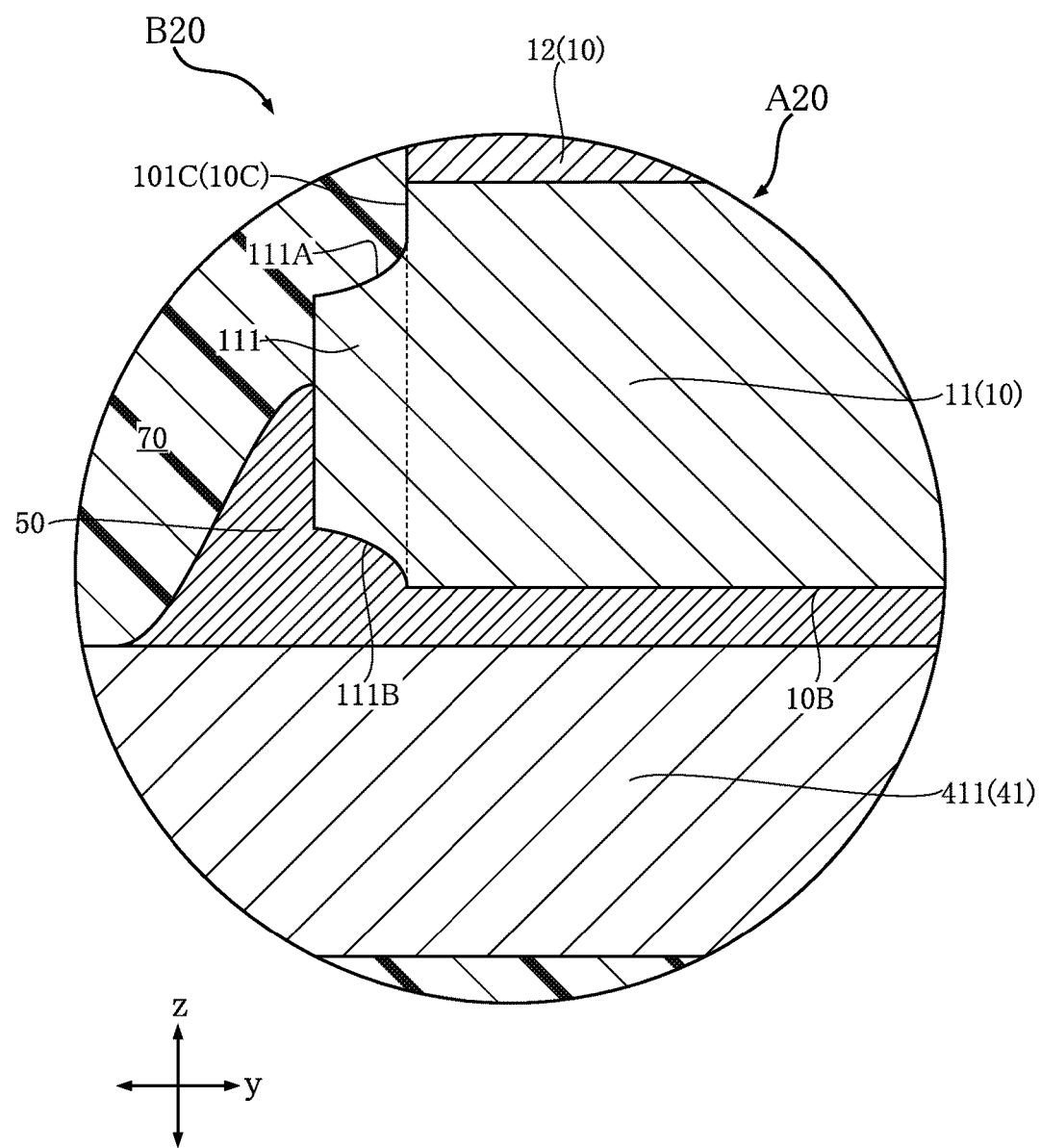

FIG. 30 is a partially enlarged view of FIG. 28.

EMBODIMENTS

Embodiments of the present disclosure are described with reference to the accompanying drawings.

With reference to FIGS. 1 to 19, a first embodiment of the present disclosure is described. The first embodiment provides a semiconductor element A10 and a semiconductor device B10 including the semiconductor element A10.

With reference to FIGS. 1 to 6, the semiconductor element A10 is described. In the illustrated example, the semiconductor element A10 includes an element body 10, a surface protective film 20, first electrodes 311, second electrodes 312 and electrically conductive barrier films 32.

Figure 1:
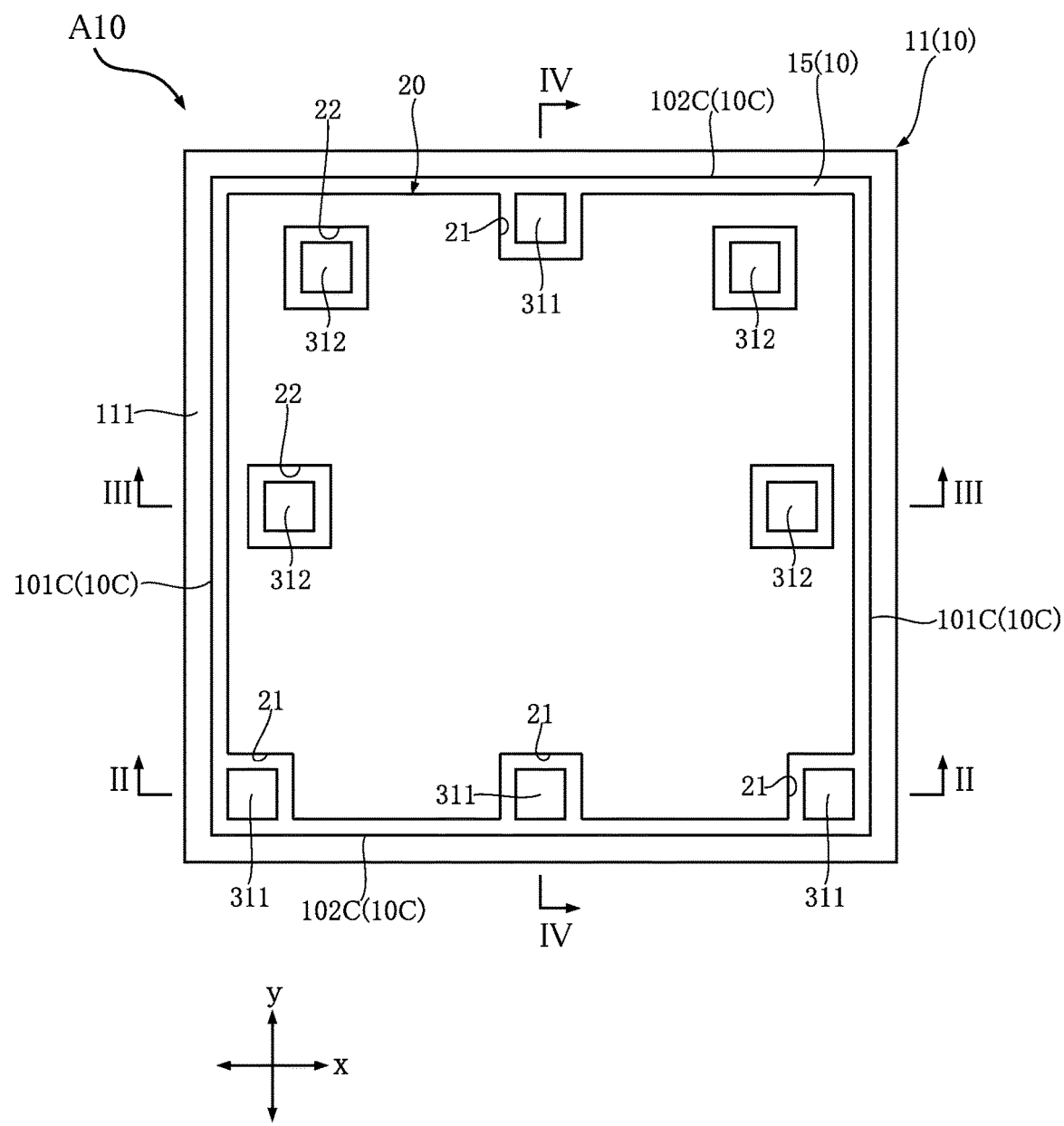
FIG. 1 is a plan view of a semiconductor element according to a first embodiment.
Figure 2:
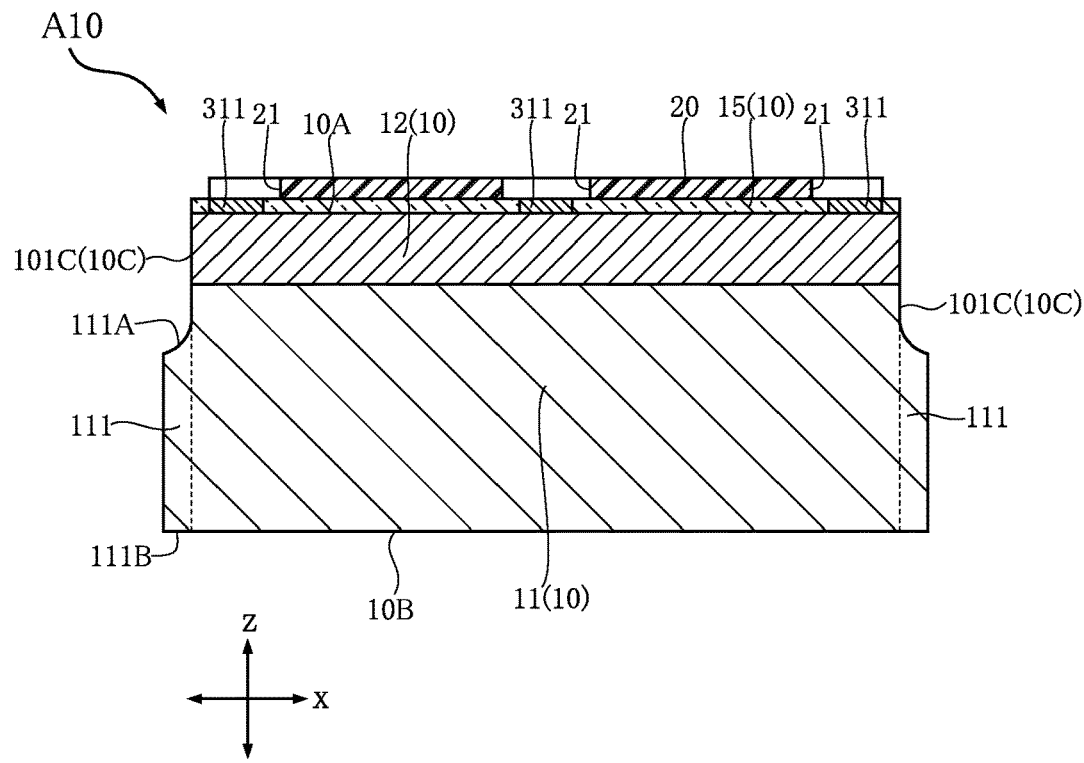
FIG. 2 is a sectional view taken along line II-II of FIG. 1.
Figure 3:
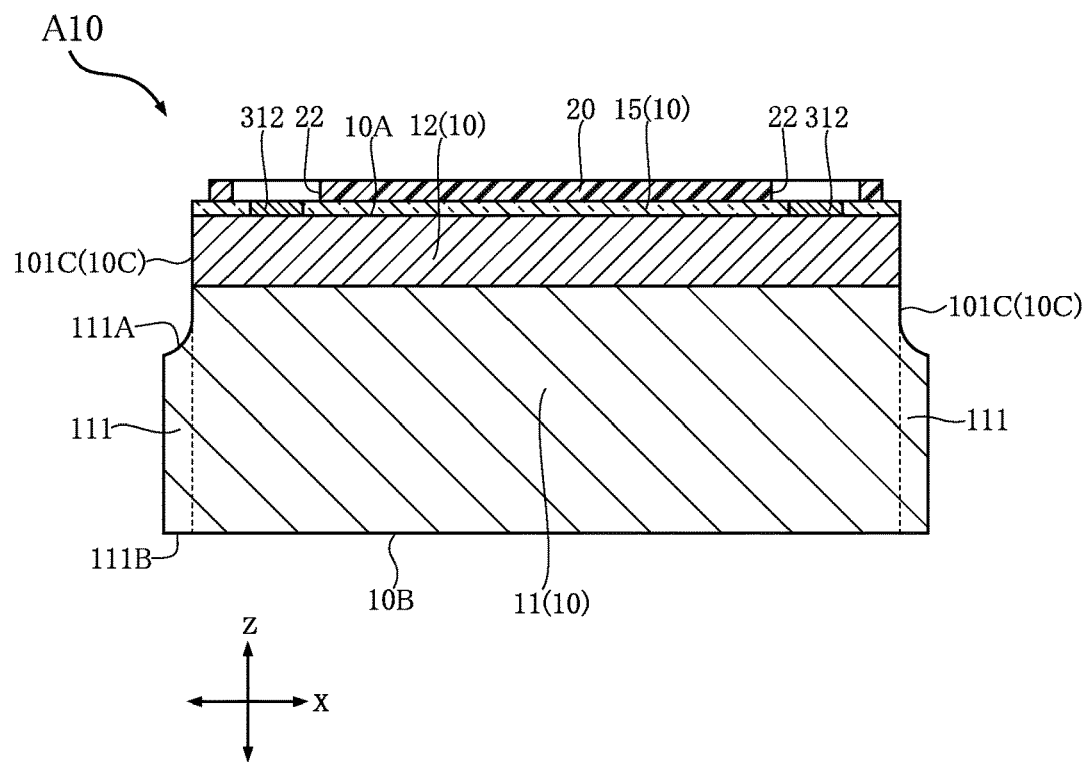
FIG. 3 is a sectional view taken along line III-III of FIG. 1.
Figure 4:
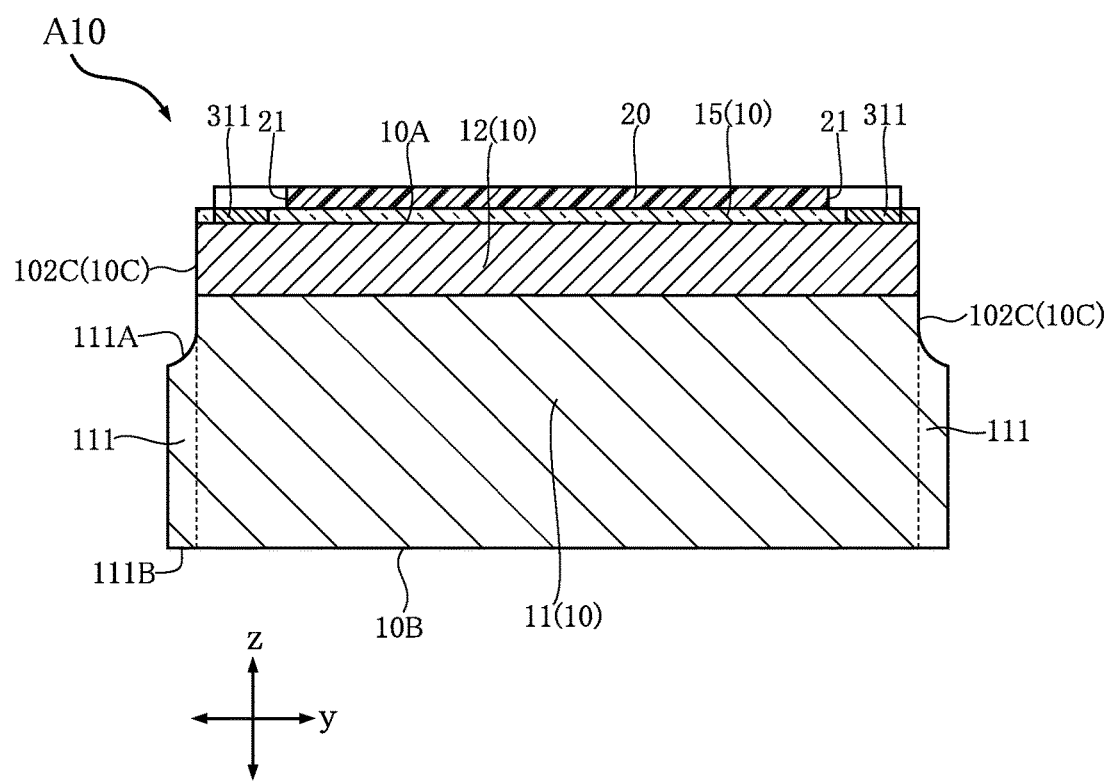
FIG. 4 is a sectional view taken along line IV-IV of FIG. 1.

As shown in FIG. 1, the element body 10 is rectangular in plan view (as viewed in a thickness direction z). As shown in FIGS. 2 to 4, the element body 10 has a front surface 10A, a back surface 10B and a side surface 10C. The front surface 10A and the back surface 10B are spaced apart and face away from each other in the thickness direction z. The side surface 10C faces in a direction perpendicular to the thickness direction z and is connected to the front surface 10A. The side surface 10C of the semiconductor element A10 has four faces. Specifically, the side surface 10C includes a pair of first faces 101C spaced apart from each other in a direction x (perpendicular to the thickness direction z) and a pair of second faces 102C spaced apart from each other in a direction y (perpendicular to the thickness direction z and the direction x). As shown in FIGS. 2 to 5, the element body 10 includes a semiconductor substrate 11, a semiconductor layer 12, an interlayer insulating film 13, a wiring layer 14 and a passivation film 15.

As shown in FIGS. 2 to 4, the semiconductor substrate 11 supports the semiconductor layer 12. The material of the semiconductor substrate 11 is undoped silicon (Si), for example. The back surface 10B of the element body provides the back surface of the semiconductor substrate 11.

As shown in FIGS. 2 to 4, the semiconductor layer 12 is deposited on the semiconductor substrate 11. The semiconductor layer 12 include p-type and n-type semiconductors forming a circuit. The circuit may include a plurality of transistors. The semiconductor layer 12 is formed by epitaxial growth. The front surface 10A of the element body 10 provides the front surface of the semiconductor layer 12.

Figure 5:
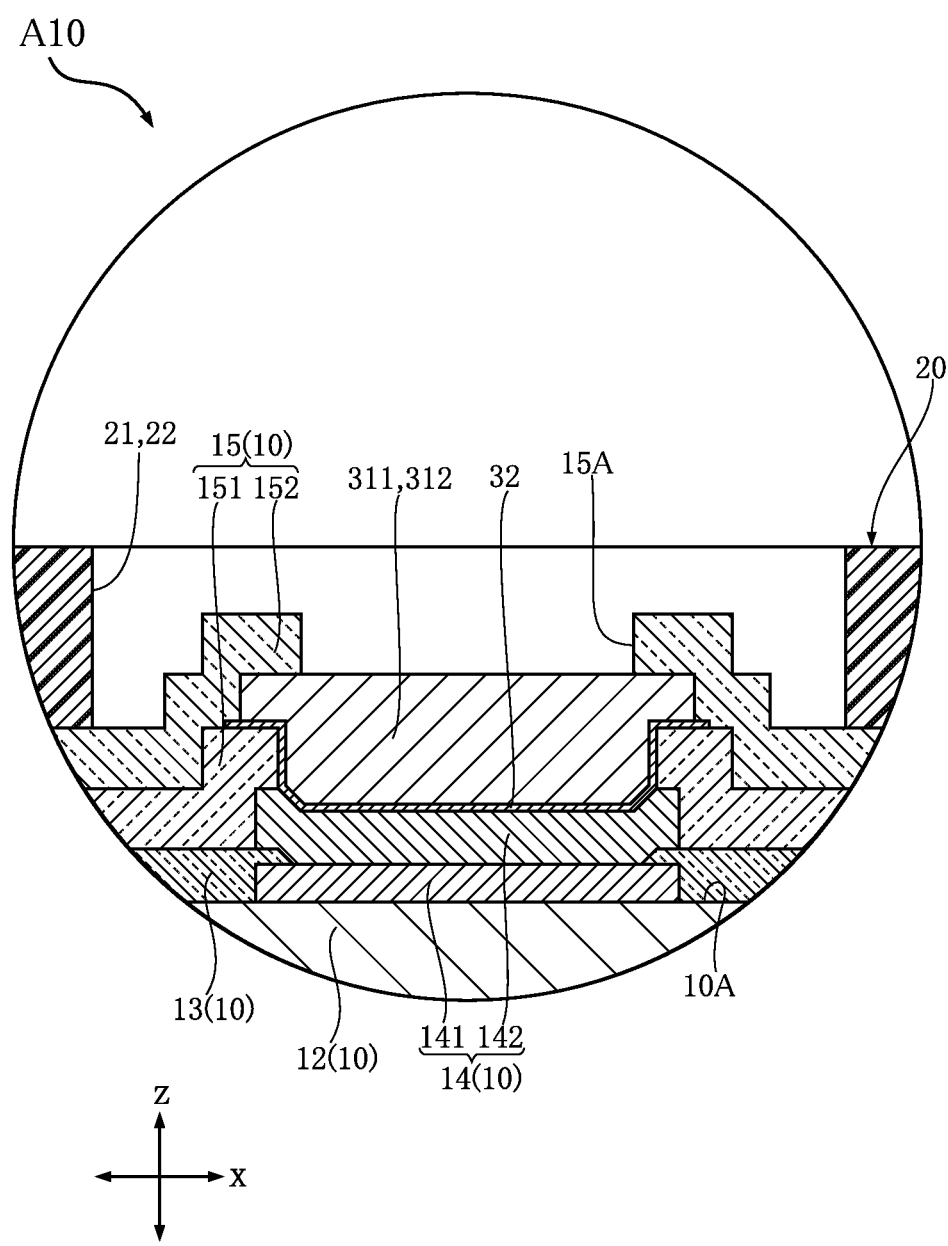
FIG. 5 is a partially enlarged view of FIG. 2 or 3.
Figure 6:
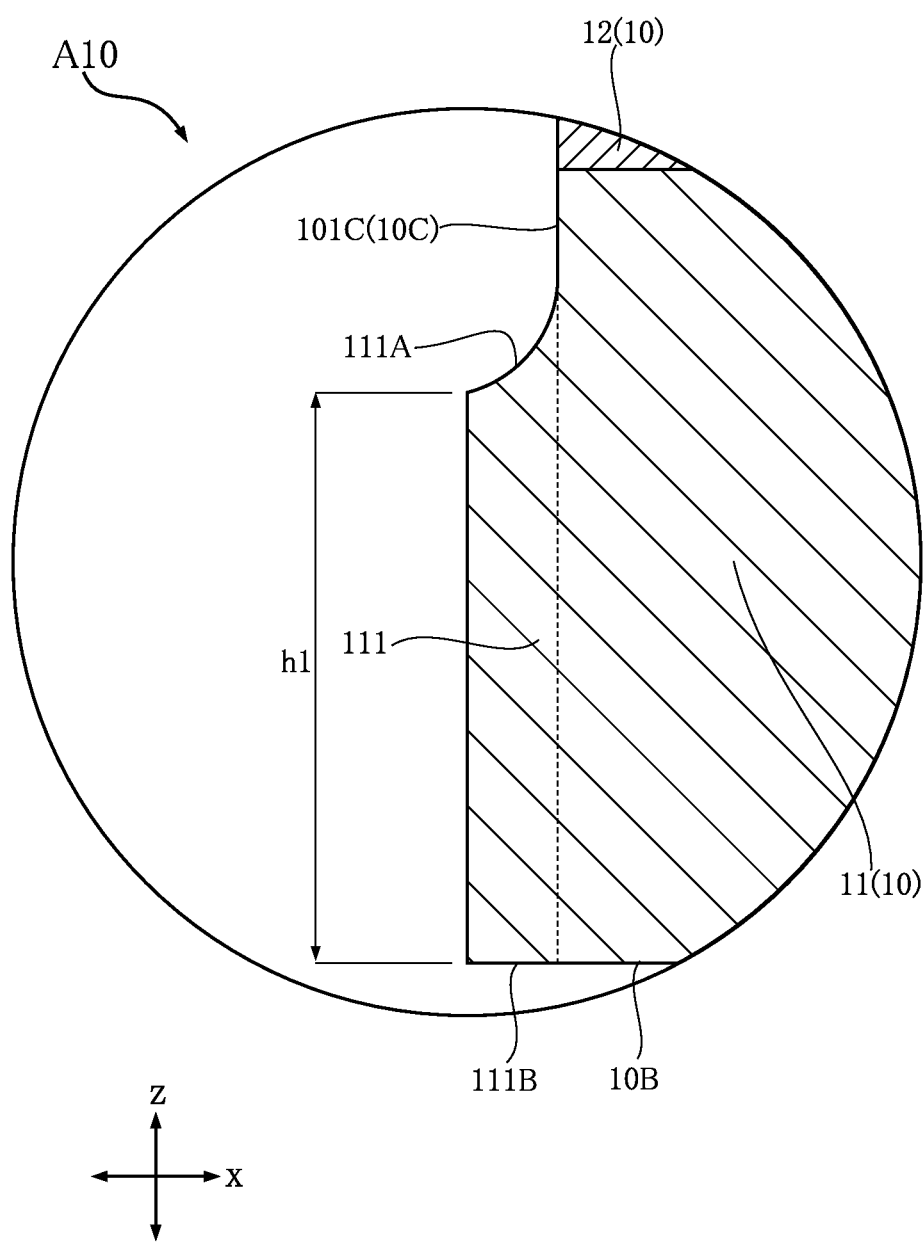
FIG. 6 is a partially enlarged view of FIG. 2 or 3.

As shown in FIG. 5, the interlayer insulating film 13 covers the front surface 10A of the semiconductor layer 12. The interlayer insulating film 13 comprises at least one of a silicon oxide ($SiO_2$) film and a silicon nitride ($Si_3N_4$) film. The interlayer insulating film 13 may be formed by plasma chemical vapor deposition (CVD), for example. In the illustrated example, the interlayer insulating film 13 is in direct contact with the predetermined regions of the front surface 10A.

As shown in FIG. 5, the wiring layer 14 is in contact with the front surface 10A of the semiconductor layer 12 and electrically connected to the semiconductor layer 12. The wiring layer 14 may be made of one or more metals selected from the group consisting, for example of, aluminum (Al), copper (Cu), titanium (Ti), tungsten (W) and tantalum (Ta). In the illustrated example, the wiring layer 14 includes a first wiring layer 141 and a second wiring layer 142. The first wiring layer 141 is in contact with both the front surface 10A and the interlayer insulating film 13. The second wiring layer 142 is stacked on the first wiring layer 141. In the illustrated example, the interlayer insulating film 13 has portions extending between the first wiring layer 141 and the second wiring layer 142.

As shown in FIG. 5, the passivation film 15 is stacked on the interlayer insulating film 13. That is, the passivation film 15 is located above the semiconductor layer 12 and not in contact with the semiconductor layer 12. The passivation film 15 is electrically insulating. In the illustrated example, the passivation film 15 includes a first film 151 and a second film 152. The first film 151 and the second film 152 may be made of silicon nitride, for example. The first film 151 may be made of silicon oxide, instead of silicon nitride. The first film 151 is in contact with both the interlayer insulating film 13 and the wiring layer 14 (the second wiring layer 142). The second film 152 is stacked on the first film 151. The second film 152 is in contact with the first electrodes 311 and the second electrodes 312. The passivation film 15 has a plurality of holes 15A passing through the first film 151 and the second wiring layer 142 in the thickness direction z. Thus, either a first electrode 311 or a second electrode 312 is exposed through each hole 15A.

The surface protective film 20 is supported on the front surface 10A of the element body 10 (the semiconductor layer 12). Specifically, as shown in FIGS. 2 to 5, the surface protective film 20 is disposed on and in contact with the passivation film 15. That is, the surface protective film 20 in the illustrated example is located above the front surface 10A of the element body 10 (semiconductor layer 12) and not in contact with the front surface 10A. The surface protective film 20 is electrically insulating. The material of the surface protective film 20 includes polyimide. The surface protective film 20 has at least one cutout portion and at least one through hole. In the illustrated example, the surface protective film 20 has a plurality of cutout portions 21 and a plurality of through holes 22.

As shown in FIGS. 1, 2 and 4, each cutout portion 21 is recessed inward from the outer edge of the surface protective film 20 as viewed in the thickness direction z. That is, each cutout portion 21 as viewed in the thickness direction z is open to the outside of the semiconductor element A10. At least one of the cutout portions 21 of the semiconductor element A10 is open in both the direction x and the direction y as viewed in the thickness direction z. As shown in FIGS. 1 and 3, each through hole 22 passes through the surface protective film 20 in the thickness direction z. Each through hole 22 is entirely surrounded by the surface protective film 20.

As shown in FIG. 5, the first electrodes 311 and the second electrodes 312 are disposed on the wiring layer 14 of the element body 10. That is, the first electrodes 311 and the second electrodes 312 are located above the front surface 10A of the element body 10 (the semiconductor layer 12). The materials of the first electrodes 311 and the second electrodes 312 include gold (Au). The first electrodes 311 and the second electrodes 312 are electrically connected to the wiring layer 14 via the respective barrier films 32. The wiring layer 14 is electrically connected to the semiconductor layer 12. Thus, the first electrodes 311 and the second electrodes 312 are electrically connected to the semiconductor layer 12 of the element body 10.

As shown in FIGS. 1, 2 and 4, each first electrode 311 is located in a corresponding one of the cutout portions 21, such that an exposed portion of the first electrode 31 (see FIG. 5) is spaced apart from the surface protective film 20 as viewed in the thickness direction z. In addition, each first electrode 311 is exposed to the outside of the semiconductor element A10 through the opening of the cutout portion 21 as viewed in the thickness direction z. As shown in FIGS. 1 and 3, each second electrode 312 is located inside a corresponding through hole 22 as viewed in the thickness direction z.

As shown in FIG. 5, each barrier film 32 is interposed between the wiring layer 14 of the element body 10 and a first electrode 311 or a second electrode 312. The barrier film 32 is in contact with the second wiring layer 142 of the wiring layer 14 and the passivation film 15 of the element body 10. The barrier film 32 is electrically conductive. The material of the barrier film 32 is titanium nitride (TiN). Thus, the barrier film 32 contains titanium.

As shown in FIGS. 1 to 4 and 6, the semiconductor substrate 11 of the element body 10 has a ledge 111 located below the side surface 10C. The ledge 111 protrudes laterally (in a direction perpendicular to the thickness direction z) beyond the side surface 10C. As viewed in the thickness direction z, the ledge 111 is adjacent to the opening of each cutout portion 21 of the surface protective film 20 (see FIG. 1). In the illustrated example, the ledge 111 is connected to the first faces 101C of the side surface 10C and the second faces 102C of the side surface 10C. That is, the ledge 111 defines a continuous (without gaps) frame surrounding the entire element body 10 as viewed in the thickness direction z.

As shown in FIGS. 2 to 4 and FIG. 6, the ledge 111 has a top surface 111A and a bottom surface 111B. The top surface 111A faces the same side as the front surface 10A of the element body 10 faces in the thickness direction z. The top surface 111A is concavely curved. The bottom surface 111B faces away from the top surface 111A. The bottom surface 111B is flush with the back surface 10B of the element body 10 (of the semiconductor substrate 11). The minimum height h1 of the ledge 111 measured from the bottom surface 111B to the outer edge of the top surface 111A (the minimum dimension of the ledge 111 in the thickness direction z) is at least 50 µm, for example. Alternatively, the minimum height h1 of the ledge 111 is preferably at least one third (⅓) of the thickness of the element body 10 (or of the semiconductor substrate 11). More preferably, the minimum height h1 of the ledge 111 is at least a half (½) of the thickness of the element body 10 (or the semiconductor substrate 11).

Figure 7:
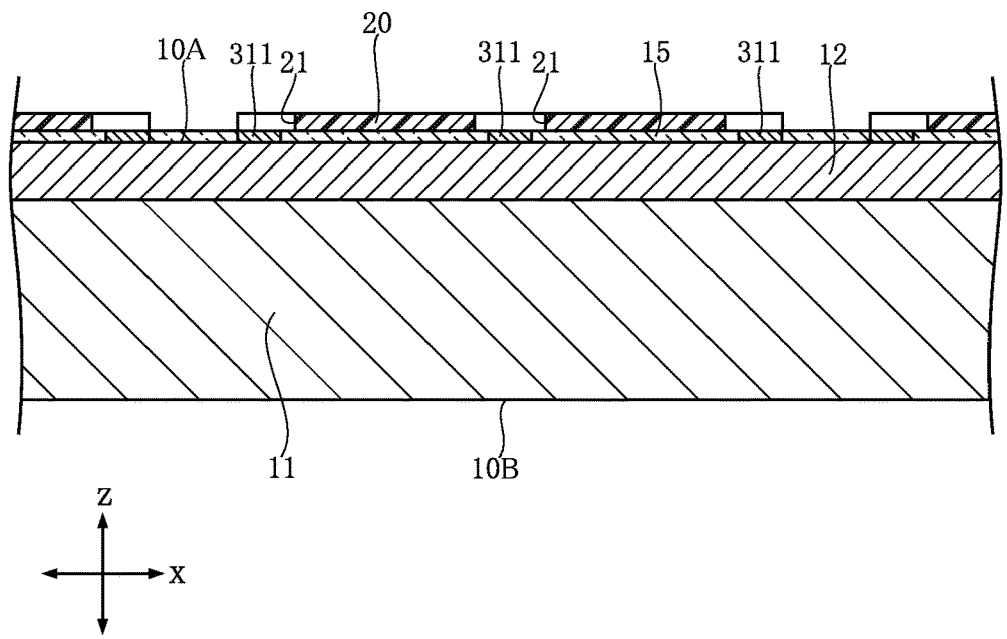
FIG. 7 is a sectional view illustrating a manufacturing process of the semiconductor element shown in FIG. 1.
Figure 8:
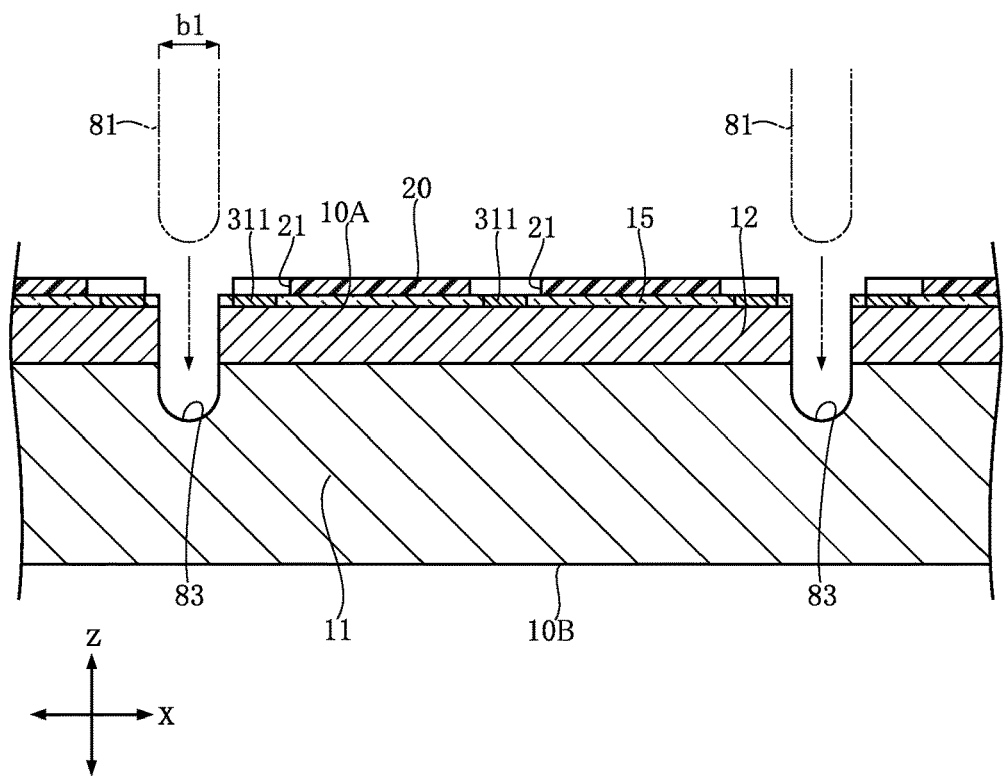
FIG. 8 is a sectional view illustrating a manufacturing process of the semiconductor element shown in FIG. 1.
Figure 9:
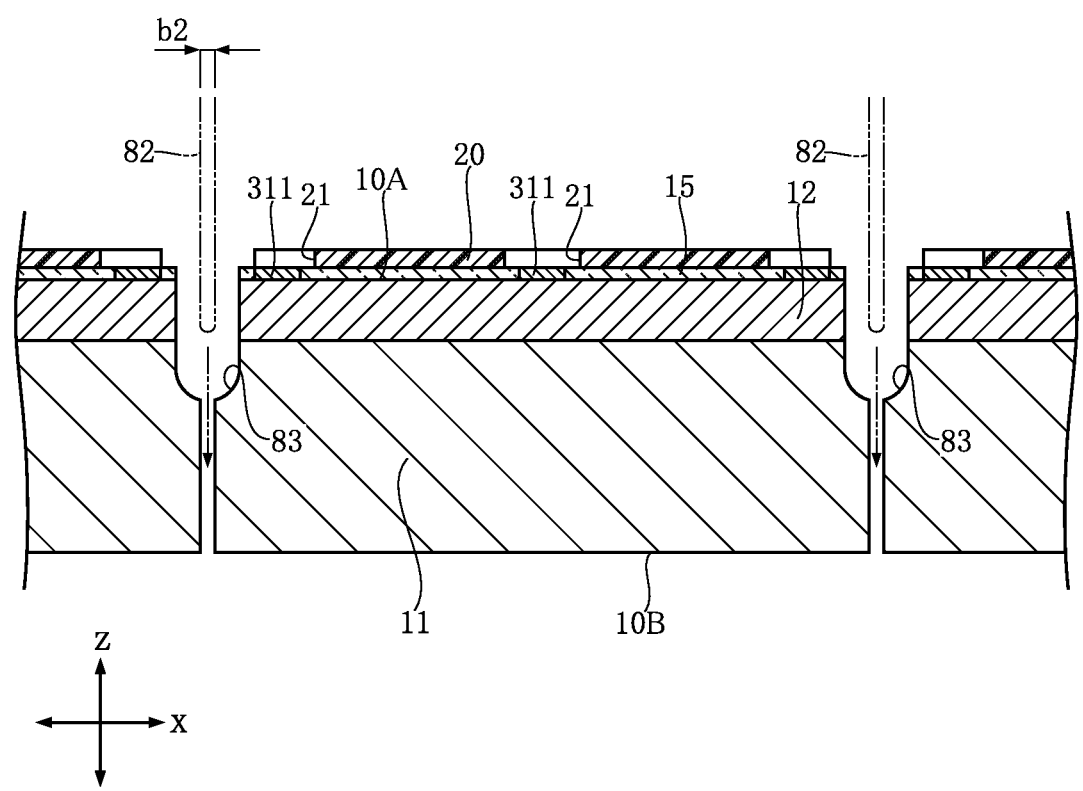
FIG. 9 is a sectional view illustrating a manufacturing process of the semiconductor element shown in FIG. 1.

With reference to FIGS. 7 to 9, a method for manufacturing a semiconductor element A10 (the ledge 111 in particular) is described.

As shown in FIG. 7, a semiconductor layer 12 is deposited on a semiconductor substrate 11. Then, the subsequent layers, including a passivation film 15, a surface protective film 20 and first electrodes 311, are disposed on the front surface 10A of the semiconductor layer 12. This process includes forming cutout portions 21 in the surface protective film 20.

Subsequently, as shown in FIG. 8, trenches 83 are formed by removing portions of the passivation film 15, the semiconductor layer 12 and the semiconductor substrate 11 using a first blade 81 having a width b1. Each trench 83 is formed to extend from the upper side as seen in FIG. 8 (from the passivation film 15 toward the back surface 10B of the semiconductor substrate 11). The trenches 83 do not pass completely through the semiconductor substrate 11. The trenches 83 include trenches extending in the direction x and trenches extending in the direction y in plan view. Thus, the trenches 83 together define a grid pattern in plan view.

Subsequently, as shown in FIG. 9, the semiconductor substrate 11 is diced into individual chips by using a second blade 82 having a width b2. The width b2 is smaller than the width b1 of the first blade 81. In the process of dicing, the semiconductor substrate 11 is cut by inserting the second blade 82 into a trench 83 and moving it further in the thickness direction z. As a result, a plurality of semiconductor elements A10 each having a ledge 111 is obtained.

Figure 10:
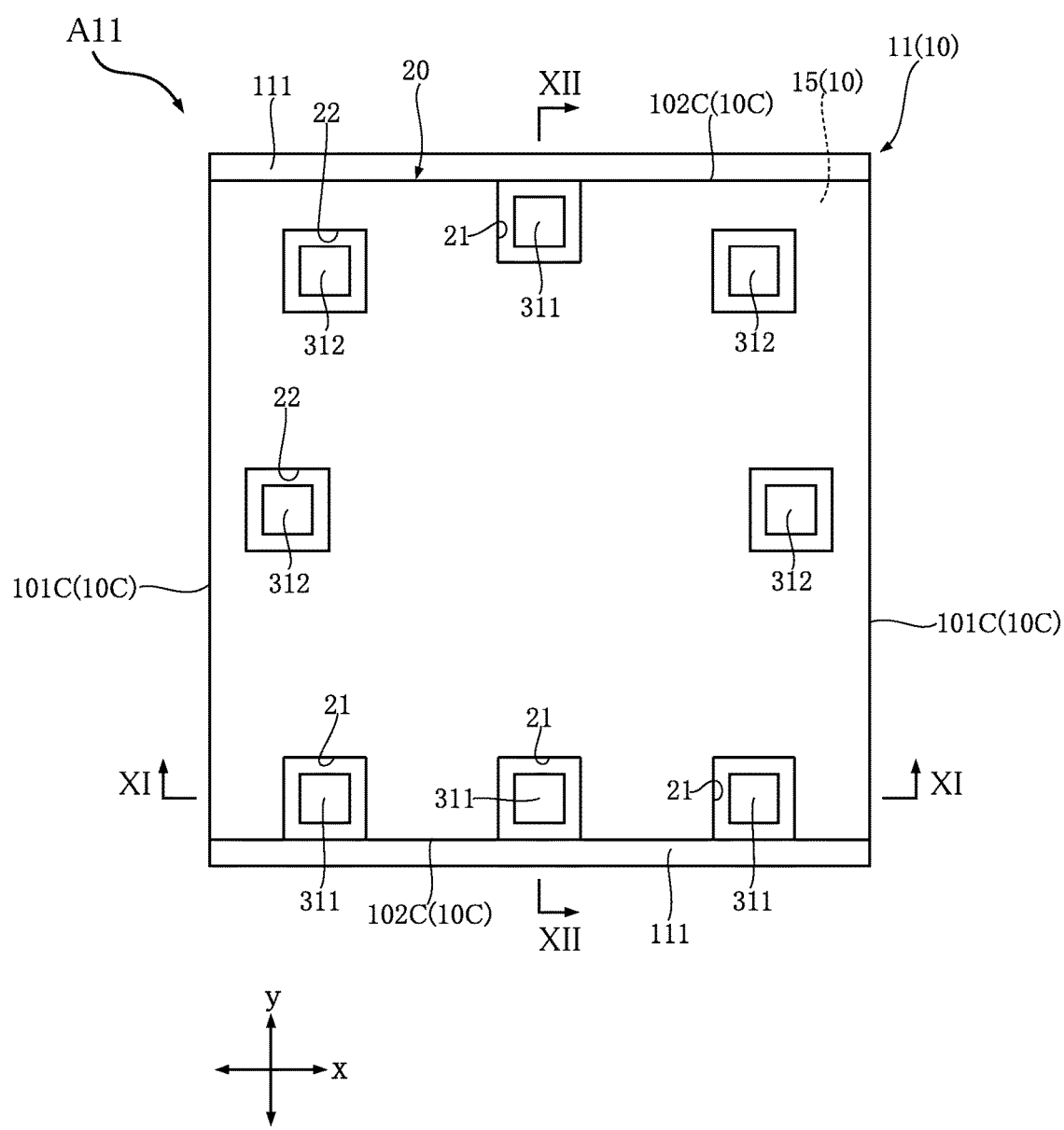
FIG. 10 is a plan view of a variation of the semiconductor element shown in FIG. 1.
Figure 11:
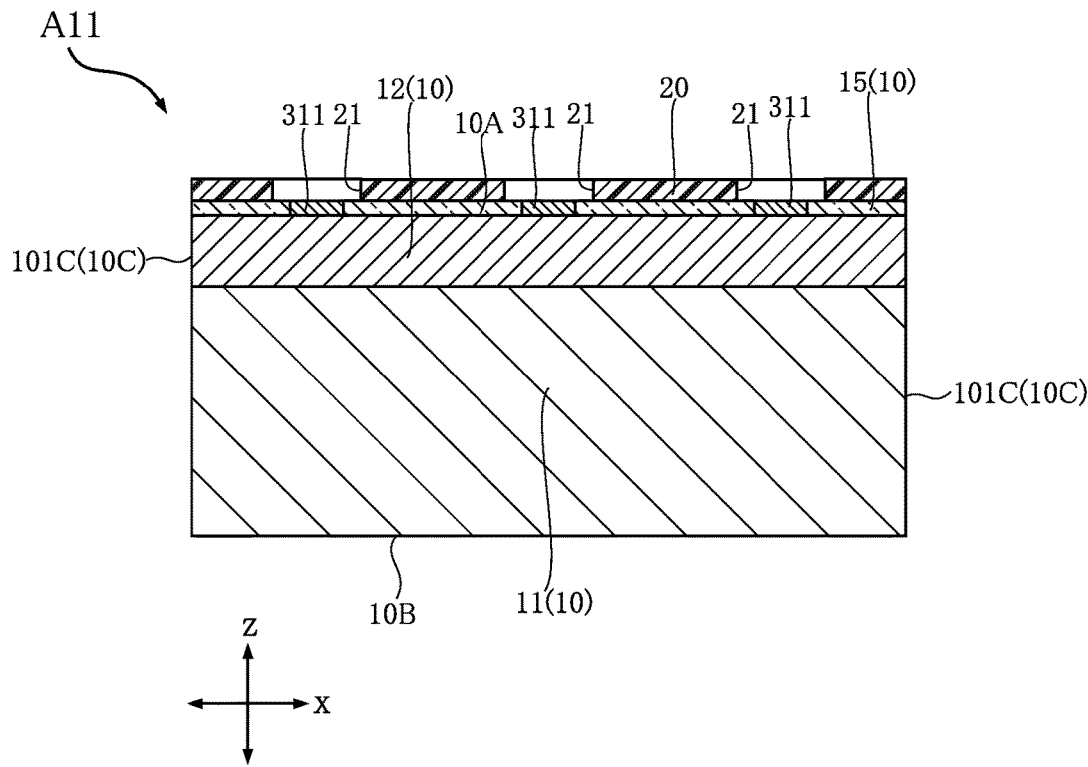
FIG. 11 is a sectional view taken along line XI-XI of FIG. 10.
Figure 12:
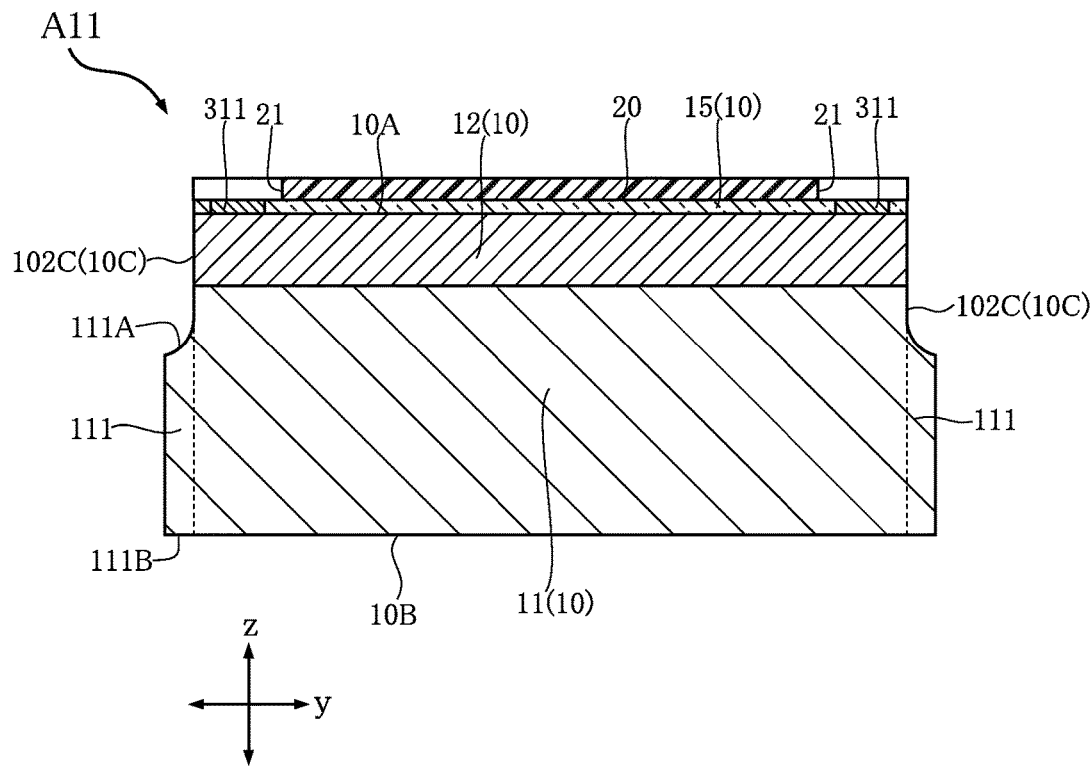
FIG. 12 is a sectional view taken along line XII-XII of FIG. 10.

FIGS. 10 to 12 show a semiconductor element A11, which is a variation of the semiconductor element A10. The semiconductor element A11 includes the surface protective film 20 and the ledge 111 that are different from those of the semiconductor element A10.

As shown in FIG. 10, the surface protective film 20 has cutout portions 21 each of which is open in the direction y as viewed in the thickness direction z.

As shown in FIGS. 10 to 12, the semiconductor element A11 is provided with the ledge 111 only along the second faces 102C of the side surface 10C. That is, each portion of the ledge 111 extends in the direction x as viewed in the thickness direction z. In other words, the portions of the ledge 111 as viewed in the thickness direction z extend in one direction perpendicular to the thickness direction z.

With reference to FIGS. 13 to 19, a semiconductor device B10 is described. The semiconductor device B10 shown in the figures includes a die pad 41, terminals 42, a bonding layer 50, wires 60 and a sealing resin 70. The semiconductor device B10 may be an operational amplifier. The semiconductor device B10 can be used in various circuits, including amplifying circuits, comparators, integrating circuits and oscillating circuits. In the example shown in FIG. 13, the semiconductor device B10 is a single outline package (SOP) device but the present disclosure is not limited to such. In FIG. 14, the sealing resin 70 is shown transparent. The phantom lines (chain double-dashed lines) represent the sealing resin 70.

As shown in FIGS. 14, 17 and 18, the die pad 41 is an electrically conductive support for mounting the semiconductor element A10 thereon. The die pad 41 and the terminals 42 are formed within the same lead frame. The material of the lead frame may be copper or a copper alloy, for example. As shown in FIGS. 14 and 18, the die pad 41 includes a main portion 411 and a pair of hanging portions 412.

As shown in FIG. 14, the main portion 411 is rectangular as viewed in the thickness direction z. The main portion 411 is where the semiconductor element A10 is mounted. The main portion 411 is plated with silver (Ag), for example.

As shown in FIGS. 14 and 18, the suspending portions 412 are spaced apart from each other in the direction x across the main portion 411. Each suspending portion 412 has a strip shape extending from the main portion 411 in the direction x. The suspending portions 412 holds the main portion 411 onto the lead frame. As shown in FIG. 16, each suspending portion 412 has an end face 412A facing in the direction x. The end face 412A is exposed on the sealing resin 70. The die pad 41 is covered by the sealing resin 70, except at the pair of end faces 412A.

As shown in FIG. 14, the terminals 42 are electrically conductive members spaced apart from the die pad 41. In the illustrated example, eight terminals are provided. In particular, the eight terminals are provided in two groups. A first group of four terminals 42 and a second group of four terminals are spaced apart from each other with the die pad 41 intervening in the direction y. In each group, the four terminals 42 are spaced apart from each other in the direction x. Each terminal 42 has a pad portion 421 and an exposed portion 422.

As shown in FIGS. 14 and 17, the pad portions 421 of the terminals 42 are covered by the sealing resin 70. The surface of the pad portion 421 may be plated with silver, for example. As shown in FIGS. 14 to 17, each exposed portion 422 protrudes out from the sealing resin 70. As viewed in the thickness direction z, the exposed portion 422 extends from the pad portion 421 in the direction x. As shown in FIGS. 16 and 17, the exposed portion 422 has a bend that is cranked as viewed in the direction x. More specifically, the exposed portion 422 has a first portion extending horizontally from the sealing resin 70, a second portion (intermediate portion) extending downward from the end of the first portion, and a third portion extending substantially horizontally (in a direction away from the sealing resin 70) from the lower end of the second portion. The exposed portion 422 is used for mounting the semiconductor device B10 onto a wiring board. The exposed portion 422 may be plated with, for example, tin (Sn).

As shown in FIGS. 17 to 19, a portion of the bonding layer 50 is located between the main portion 411 of the die pad 41 and the back surface 10B of the element body 10. The bonding layer 50 contains silver (Ag) particles. The material of the bonding layer 50 may be an epoxy resin containing Ag particles. The bonding layer 50 also has a portion adhering to the ledge 111 of the semiconductor element A10.

As shown in FIGS. 14 and 17, the wires 60 connect the semiconductor element A10 to the terminals 42. Specifically, each wire 60 connects a first electrode 311 or a second electrode 312 of the semiconductor element A10 to a corresponding terminal 42 (pad portion 421). In this way, the electrodes 311 and 312 are electrically connected to the terminals 42. The material of the wires 60 is gold, for example.

As shown in FIGS. 17 and 18, the sealing resin 70 covers the semiconductor element A10, the bonding layer 50, the wires 60 and the die pads 41 (except the end faces 412A). The sealing resin 70 covers a portion of each terminal 42. The material of the sealing resin 70 is a black epoxy resin, for example. The sealing resin 70 has a front surface 71, a back surface 72, a pair of first side surfaces 731 and a pair of second side surfaces 732.

As shown in FIGS. 17 and 18, the front surface 71 faces one side in the thickness direction z (the upper side in FIGS. 17 and 18). The back surface 72 faces the opposite side from the front surface 71 (the lower side in FIGS. 17 and 18). When the semiconductor device B10 is mounted on a wiring board, the back surface 72 faces the wiring board.

As shown in FIGS. 14 to 17, the pair of first side surfaces 731 are spaced apart from each other in the direction y. Each first side surface 731 is connected to the front surface 71 and the back surface 72. The exposed portions 422 of the terminals 42 stick out from the corresponding first side surfaces 731.

As shown in FIGS. 14 to 16 and 18, the pair of second side surfaces 732 are spaced apart from each other in the direction x. Each second side surface 732 is connected to the front surface 71 and the back surface 72. In addition, each second side surface 732 is connected to the pair of first side surfaces 731. The end face 412A of a corresponding suspending portion 412 is exposed on each second side surface 732.

The following describes advantages of the semiconductor element A10 and the semiconductor device B10.

The semiconductor element A10 includes the element body 10, which has the front surface 10A and the side surface 10C, and the surface protective film 20 disposed above the front surface 10A. The surface protective film 20 has the cutout portions 21 recessed inward from the outer edge of the surface protective film 20 as viewed in the thickness direction z. The first electrodes 311, which are electrically connected to the element body 10, are disposed in the respective cutout portions 21. The element body 10 is provided with the ledge 111 protruding in the direction perpendicular to the thickness direction z. As viewed in the thickness direction z, the ledge 111 is adjacent to the opening of each cutout portion 21. With this structure, the ledge 111 prevents, as shown in FIG. 19, the bonding layer 50 from being pulled up by capillary action to reach the side surface 10C. Therefore, the bonding layer 50 thus formed does not contact the first electrodes 311.

Providing the element body 10 with the ledge 111 increases the surface area of the element body 10. The bonding layer 50 can thus have a greater area bonded to the element body 10, which increases the bonding strength of the semiconductor element A10 to the die pad 41.

The material of the surface protective film 20 includes polyimide. Even so, providing such a surface protective film 20 with the cutout portions 21 prevents migration of the silver ions contained in the bonding layer 50 and a consequent short circuit of first electrodes 311.

The first electrodes 311 contain gold, which ensures a sufficient bonding strength of the wires 60 to the first electrodes 311.

As viewed in the thickness direction, the ledge 111 extends along the entire edge of the element body 10. This reliably prevents the bonding layer 50 from being pulled up by capillary action to reach the side surface 10C.

The semiconductor element A10 has the barrier films interposed between the wiring layer 14 and the respective first electrodes 311 in thickness direction z (see FIG. 5). The barrier films 32 contain titanium. This allows the first electrodes 311 to form Ohmic contact with the wiring layer 14. This also prevents diffusion of gold from the first electrode 311 into the element body 10.

With reference to FIGS. 20 to 30, a second embodiment of the present disclosure will be described. The second embodiment provides a semiconductor element A20 and a semiconductor device B20 including the semiconductor element A20. In the figures, the same or similar elements to those of the first embodiment described above are denoted by the same reference signs and no description of such elements is given to avoid redundancy.

FIGS. 20 to 23 are for illustrating the semiconductor element A20. The semiconductor element A20 includes a ledge 111 having a different structure from that of the semiconductor element A10 described above.

As shown in FIGS. 21 to 23, the ledge 111 has a bottom surface 111B that is offset from the back surface 10B of the element body 10 (semiconductor substrate 11) toward the front surface 10A of the element body 10 (semiconductor layer 12) in the thickness direction z. In other words, the bottom surface 111B of the second embodiment is not flush with the back surface 10B. In the illustrated example, the bottom surface 111B is concavely curved. As shown in FIG. 20, the shape of the semiconductor element A20 as viewed in the thickness direction z is the same as that of the semiconductor element A10. As shown in FIG. 23, the ledge 111 has a minimum height h2 (minimum dimension of the ledge 111 in the thickness direction z). The minimum height h2 is a length in the thickness direction z from the lower end (inner edge) of the bottom surface 111B to the lower end (outer edge) of the top surface 111A. The minimum height h2 is at least 50 μm, for example.

The semiconductor element A20 may be provided with the ledge 111 that extends only in one direction perpendicular to the thickness direction z as in the semiconductor element A11 (see FIG. 10).

With reference to FIGS. 24 to 26, a method for manufacturing the semiconductor element A20 (the ledge 111 in particular) is described.

Similarly to the first embodiment, the structure (composed of a semiconductor substrate 11, a semiconductor layer 12 and a passivation film 15) as shown in FIG. 7 is prepared. Then, as shown in FIG. 24, trenches 83 are formed by removing portions of the passivation film 15, the semiconductor layer 12 and the semiconductor substrate 11 using the first blade 81 having a width b1. Each trench 83 is formed to extend downward from the top as seen in FIG. 24 (from the passivation film 15 toward the back surface 10B of the semiconductor substrate 11). The trenches 83 do not extend completely through the semiconductor substrate 11. The trenches 83 include trenches extending in the direction x and trenches extending in the direction y in plan view. Thus, the trenches 83 together define a grid pattern in plan view.

Next, as shown in FIG. 25, the first blade 81 is placed to face the back surface 10B of the semiconductor substrate 11. Subsequently, a second trench 832 is formed by removing portions of the semiconductor substrate 11 using the first blade 81, so that the second trench 832 thus formed extends upward from the bottom as seen in the figure (extending from the back surface 10B toward the front surface 10A). This process is repeated until a plurality of trenches 832 are formed in the back surface 10B of the semiconductor substrate 11. The second trenches 832 are formed at the locations corresponding to the first trenches 831 in plan view. Thus, the second trenches 832 also define a grid pattern similar to that defined by the first trenches 831. In the illustrated example, when the depth in the semiconductor substrate 11 (the maximum length measured in the direction x) is compared, the second trenches 832 are less than the first trenches 831. However, the present disclosure is not limited to such.

Next, as shown in FIG. 26, the semiconductor substrate 11 is diced into individual chips by using the second blade 82 having a width b2. The width b2 is smaller than the width b1 of the first blade 81. In the process of dicing, the second blade 82 is inserted into a first trench 831 and then moved further in the thickness direction z until the second blade 82 reaches the corresponding second trench 832. This produces a plurality of semiconductor elements A20 provided with ledges 111.

With reference to FIGS. 27 to 30, the semiconductor device B20 is described. The semiconductor device B20 differs from the semiconductor device B10 in that the semiconductor element A20 have a different structure from the semiconductor element A10. Yet, the semiconductor element A20 is mounted on the die pad 41 as shown in FIG. 27, in a similar configuration to that of the semiconductor element A10 in the semiconductor device B10 (see FIG. 14). In addition, the semiconductor element A20 is connected to the terminals 42 with the connection configuration (FIG. 27) similar to that employed in the first embodiment (FIG. 14).

As shown in FIGS. 28 and 29, a portion of the bonding layer 50 adheres to the ledge 111 of the semiconductor element A20. As shown in FIG. 30, the bonding layer 50 is in contact with the entire bottom surface 111B of the ledge 111.

The following describes advantages of the semiconductor element A20 and the semiconductor device B20.

Similarly to the semiconductor device A10 described above, the semiconductor element A20 has the ledge 111. As shown in FIG. 30, this structure can prevent the bonding layer 50 from being pulled up by capillary action to reach the side surface 10C. In this way, the semiconductor device B20 is also advantageous in that the bonding layer 50 is prevented from coming into contact with the first electrodes 311.

In the semiconductor element A20, the bottom surface 111B of the ledge 111 is recessed from the back surface 10B of the element body 10 (the semiconductor substrate 11) toward the front surface 10A of the element body 10 (semiconductor layer 12). By adhering in part to such a bottom surface 111B, the bonding layer 50 can bond the semiconductor element A20 to the die pad 41 more strongly.

The present disclosure is not limited to the embodiments described above. Various design changes can be made to the specific elements and components illustrated in the embodiments.

The invention claimed is:

1. A semiconductor element comprising:
an element body having a front surface and a side surface connected to the front surface;
a surface protective film supported on the front surface of the element body, the surface protective film having a cutout portion recessed inward from an outer edge of the surface protective film as viewed in a thickness direction of the element body; and
an electrode disposed in the cutout portion and electrically connected to the element body, wherein
the element body has a ledge protruding with respect to the side surface in a direction perpendicular to the thickness direction,
the ledge is adjacent to an opening of the cutout portion as viewed in the thickness direction, and the ledge is at least one third of the element body in size along the thickness direction.

2. The semiconductor element according to claim 1, wherein the surface protective film contains polyimide.

3. The semiconductor element according to claim 1, wherein the electrode contains gold.

4. The semiconductor element according to claim 1, wherein the element body includes a semiconductor substrate, a semiconductor layer formed on the semiconductor substrate, and a passivation film supported on the semiconductor layer, and
the electrode is electrically connected to the semiconductor layer, the surface protective film is in contact with the passivation film, and the ledge is formed on the semiconductor substrate.

5. The semiconductor element according to claim 4, wherein the semiconductor substrate has a back surface opposite to the front surface,
the ledge has a top surface and a bottom surface spaced apart from each other in the thickness direction, and
the bottom surface of the ledge is flush with the back surface.

6. The semiconductor element according to claim 5, wherein the top surface of the ledge is concavely curved.

7. The semiconductor element according to claim 4, wherein the semiconductor substrate has a back surface opposite to the front surface,
the ledge has a top surface and a bottom surface spaced apart from each other in the thickness direction, and
the bottom surface of the ledge is offset from the back surface toward the front surface in the thickness direction.

8. The semiconductor element according to claim 7, wherein the top surface of the ledge is concavely curved.

9. The semiconductor element according to claim 7, wherein the bottom surface of the ledge is concavely curved.

10. The semiconductor element according to claim 1, wherein the ledge extends in a single direction perpendicular to the thickness direction as viewed in the thickness direction.

11. The semiconductor element according to claim 1, wherein the ledge extends continuously along an entire edge of the element body as viewed in the thickness direction.

12. The semiconductor element according to claim 4, further comprising a wiring layer electrically connecting the semiconductor layer and the electrode, wherein
the wiring layer is in contact with the passivation film.

13. The semiconductor element according to claim 12, further comprising a barrier film interposed between the wiring layer and the electrode in the thickness direction,
wherein the barrier film contains titanium.

14. A semiconductor device comprising:
a semiconductor element in accordance with claim 1;
a die pad on which the semiconductor element is mounted; and
a bonding layer interposed between the die pad and the semiconductor element,
wherein the bonding layer contains Ag particles.

15. The semiconductor device according to claim 14, further comprising:
a terminal spaced apart from the die pad; and
a wire connected to the terminal and the electrode.

16. The semiconductor device according to claim 15, further comprising a sealing resin covering the semiconductor element and the wire.

17. The semiconductor element according to claim 1, wherein an entirety of the surface protective film is spaced apart from the front surface of the element body in the thickness direction.

18. The semiconductor element according to claim 1, wherein a front surface of the surface protective film is disposed a distance in the thickness direction from the front surface of the element body that is greater than a distance in the thickness direction from the front surface of the element body for an entirety of the electrode.

19. The semiconductor element according to claim 4, wherein the passivation film is disposed between the semiconductor layer and the surface protective film.

20. The semiconductor element according to claim 4, wherein the semiconductor layer is smaller in size along the thickness direction than the semiconductor substrate.

* * * * *